US010724863B2

(12) United States Patent
Vasilyuk et al.

(10) Patent No.: US 10,724,863 B2
(45) Date of Patent: Jul. 28, 2020

(54) METHOD AND DEVICE FOR CALIBRATION OF A THREE-AXIS MAGNETOMETER

(71) Applicant: TOPCON POSITIONING SYSTEMS, INC., Livermore, CA (US)

(72) Inventors: Nikolay Nikolaevich Vasilyuk, Moscow (RU); Alexandr Vladimirovich Doronin, Moscow (RU); Sergey Ivanovich Tychinskiy, Moscow (RU); Anton Vladimirovich Klimenkov, Moscow (RU)

(73) Assignee: Topcon Positioning Systems, Inc., Livermore, CA (US)

( * ) Notice: Subject to any disclaimer, the term of this patent is extended or adjusted under 35 U.S.C. 154(b) by 386 days.

(21) Appl. No.: 15/564,481

(22) PCT Filed: Feb. 1, 2016

(86) PCT No.: PCT/RU2016/000038
§ 371 (c)(1),
(2) Date: Oct. 5, 2017

(87) PCT Pub. No.: WO2017/135836
PCT Pub. Date: Aug. 10, 2017

(65) Prior Publication Data
US 2018/0080768 A1    Mar. 22, 2018

(51) Int. Cl.
*G01C 17/38*    (2006.01)
*G01R 33/02*    (2006.01)
(Continued)

(52) U.S. Cl.
CPC ............. *G01C 17/38* (2013.01); *G01C 17/28* (2013.01); *G01P 15/18* (2013.01); *G01R 33/0206* (2013.01); *G01R 35/005* (2013.01)

(58) Field of Classification Search
CPC ...... G01C 17/38; G01C 21/165; G01C 17/28; G01R 33/0035; G01R 33/02;
(Continued)

(56) References Cited

U.S. PATENT DOCUMENTS 5,134,369 A    7/1992    Lo et al.
6,130,534 A    10/2000    Huang et al.
(Continued)

FOREIGN PATENT DOCUMENTS

WO    2014022664 A2    2/2014

OTHER PUBLICATIONS

Extended Search Report dated Aug. 23, 2019, in connection with European Patent Application No. 16889559.7, 9 pgs.
(Continued)

*Primary Examiner* — Kyle R Quigley
(74) *Attorney, Agent, or Firm* — Chiesa Shahinian & Giantomasi PC

(57) ABSTRACT

A method and device for calibration of a three-axis magnetometer that facilitates a more efficient and routine procedure by calibration of hard and soft iron errors of a 3D-magnetometer integrated into a mobile electronic device, and a set of operations for coprocessing measurements of the 3D-magnetometer and inertial sensors (e.g., a 3D-accelerometer and 3D-gyro), which can determine magnetic heading and attitude of the electronic device.

26 Claims, 13 Drawing Sheets

(51) Int. Cl.
*G01R 35/00* (2006.01)
*G01C 17/28* (2006.01)
*G01P 15/18* (2013.01)

(58) Field of Classification Search
CPC .............. G01R 33/028; G01R 35/005; G01R 33/0206; G01P 15/18
See application file for complete search history.

(56) References Cited

U.S. PATENT DOCUMENTS

| | | | |
|---|---|---|---|
| 7,451,549 | B1 | 11/2008 | Sodhi et al. |
| 8,065,074 | B1 | 11/2011 | Liccardo |
| 8,717,009 | B2 | 5/2014 | Tu |
| 2012/0101762 | A1 | 4/2012 | Almalki et al. |
| 2013/0124129 | A1* | 5/2013 | Waters .................. G01C 17/38 702/92 |
| 2013/0238268 | A1 | 9/2013 | Sheng |
| 2013/0245984 | A1* | 9/2013 | Sheng ................ G01R 33/0035 702/94 |
| 2013/0320963 | A1 | 12/2013 | Veilleux et al. |
| 2015/0019159 | A1* | 1/2015 | Elgersma ............. G01R 35/005 702/150 |
| 2015/0177020 | A1* | 6/2015 | An ........................ G01C 17/38 702/92 |

OTHER PUBLICATIONS

Alonso, et al., "Complete Linear Attitude-Independent Magnetometer Calibration", The Journal of Astronautical Science, Oct.-Dec. 2002, pp. 477-490, vol. 50, No. 4.

Markovsky, et al., "Consistent Least Squares Fitting of Ellipsoids", Numerische Mathematik, Apr. 8, 2004, pp. 177-194, Springer-Verlag.

Gander, et al., "Least-Squares Fitting of Circles and Ellipses", Standford University, 22 pgs.

Shuster, Malcolm D., "Deterministic Three-Axis Attitude Determination", The Journal of the Astronautical Sciences, Jul.-Sep. 2004, pp. 405-419, vol. 52, No. 3.

Bar-Itzhack, et al., "Request—A Recursive QUEST Algorithm for Sequential Attitude Determination", Journal of Guidance, Control, and Dynamics, 1996, pp. 1034-1038, vol. 19, No. 5, NASA Goddard Space Flight Center, Maryland.

International Search Report and Written Opinion dated Oct. 27, 2016, in connection with International Patent Application No. PCT/RU2016/000038, 6 pgs.

* cited by examiner

METHOD AND DEVICE FOR CALIBRATION OF A THREE-AXIS MAGNETOMETER

CROSS-REFERENCE TO RELATED APPLICATIONS

This application is a national stage (under 35 U.S.C. 371) of International Patent Application No. PCT/RU2016/000038, filed Feb. 1, 2016, which is herein incorporated by reference in its entirety.

TECHNICAL FIELD

The present invention relates generally to measurements and operations from magnetic and inertial sensors for calibration of a 3-axis magnetometer and, more particularly, to the calibration of a three-axis magnetometer for the elimination of systematic errors in measurements of the Earth's magnetic field induced by a variety of elements.

BACKGROUND OF THE INVENTION

Modern micro electronic technologies allow for the mass production of three-axis magnetometers for measuring three projections of a magnetic field vector onto three mutually-perpendicular axes. Such three-dimensional sensors are produced both as separate magnetic sensor chips and as chip-scale dies for integration into a System-on-Chip (SoC) together with other electronic sensors (e.g., 3D-accelerometers, 3D-gyros, and the like), data processing devices and/or interface units. As will be appreciated, these types of three-axis magnetometers are widely used as navigation and device attitude sensors in mobile electronic devices such as smartphones, tablets, and the like.

A three-axis magnetometer (also referred to herein as a "3D-magnetometer) is typically mounted to or in an electronic device on the housing of the electronic device or installed onto a printed circuit board (PCB) rigidly fixed within the housing of the device. For both mountings, sensitivity axes of the magnetometer have a fixed orientation relative to the housing thereby allowing for a determination of orthogonal projections of the magnetic field vector and the orientation of the device housing relative to the magnetic field vector.

However, 3D-magnetometer measurements are not enough for determination of the full spatial orientation of the device housing, since any random housing rotation about the magnetic field vector of an external magnetic field does not change the vector projections on the magnetometer sensitivity axes. As such, to determine full orientation of the housing, one needs to measure three orthogonal projections of another permanent vector that is non-collinear to the magnetic field vector at a given point. For example, a free falling acceleration vector is one such vector for a stationary electronic device. Using such a free falling acceleration vector, vector components are measured by a 3D-accelerometer in the form of a specific acceleration vector directed to the opposite direction relative to the free falling acceleration vector. By co-processing measurements of the 3D-magnetometer and 3D-accelerometer one is able to unambiguously define a spatial orientation of the device housing for most areas of the Earth excluding areas close to the North and South Celestial Poles. In the vicinity of these Celestial Poles the condition of non-collinearity of the specific acceleration vector and magnetic field is violated, and such co-processing fails to uniquely orient the device to achieve the desired calibration, for example.

The magnetic field inside the electronic device is different from the natural magnetic field of the Earth. Magnetic field distortions in the housing generally fall into two main categories. The first distortion type is caused by an additional magnetic field from constant magnets, direct current circuits, and/or any magnetized elements in the device. This distortion type is a so-called "hard iron" error and produces a constant addition to the 3D-magnetometer measurements, and such hard iron errors do not disappear when the external magnetic field(s) disappear.

The second error distortion type relates to magnetic-sensitive structure elements whose magnetization is determined by the magnitude and direction of the applied magnetic field. This applied field is the sum of the Earth's magnetic field and the hard iron magnetic field. These structural elements, under the influence of the applied magnetic field, create their own additional magnetic field which is linear to the vector of the applied magnetic field. As such, the vector of the created field is added to the magnetic vector of the applied field and the sum vector measured by the magnetometer is different from the external field vector in both magnitude and direction. Such errors are so-called "soft iron" errors, and disappear when the applied magnetic field(s) disappear.

Thus, the three-axis magnetometer inside an electronic device measures various components of a complex magnetic field including but not limited to the Earth's magnetic field and magnetic fields of direct currents distorted by magnetic-sensitive structural elements rather than vector components of the Earth's natural magnetic field. Such a complex combination of magnetic fields considerably distorts the relatively weak natural Earth's magnetic field and makes it impossible to directly determine a magnetic direction for a device on the basis of magnetometer raw measurements.

The distortion of the magnitude and direction of the Earth's magnetic field vector is not only due to structural components but also due to the 3D-magnetometer itself which may introduce measurement errors. In fact, the uni-axial sensitive element of the 3D magnetometer converts the magnetic field projection first to an electric signal and then to a digital code. In the simplest case such a conversion can be presented as a multiplication operation of the measured projection by a scaling factor and the addition of a constant zero-offset to the multiplication result. Ideally, the scaling factors are equal, and zero-offsets should be zero for all sensitive elements of the 3D-magnetometer. But, due to a plurality of random factors and permissible errors in industrial production of magnetometers, actual scaling factors and offsets have non-systematic variations from ideal values. Manufacturing errors can also cause a random distortion of a magnetometer's sensor frame, that is, actual directions of single sensitivity axes do not form an orthogonal sensor frame.

Measuring inaccuracies (e.g., scaling factors variations, non-zero offsets and distortions of measuring bases) can be similarly described in 3D-accelerometers and 3D-gyroscopes. A combination of these factors results in systematic errors in vector measurements, that is, projections of the magnetic field vector for 3D-magnetometers, projections of the specific acceleration vector for 3D-accelerometers and projections of the angular rate vector for 3D-gyros.

Measurements of the integrated 3D-magnetometer to determine the device's magnetic heading and attitude are possible only after correcting all systematic errors and isolating the components corresponding to the Earth's magnetic vector from the corrected measurements. To do this, systematic errors in sensors and any magnetic parasitic components inside the electronic device should be determined. A simple solution can be a laboratory calibration of the magnetometer as a part of the integrated device. But parameters of chip-scale magnetometers and internal magnetic field change in time. In addition, such calibration in mass production of electronic devices can considerably exceed the cost of the chip-scale magnetometer itself. Therefore, laboratory calibration is typically not a reasonable solution for chip-scale magnetometers.

Alternatively, there are a number of other known calibration techniques for a magnetometer integrated in an electronic device having simultaneous measurements from inertial sensors. For example, U.S. Pat. No. 7,451,549 to R. Sodhi et al. discloses recurrent calibration algorithms for soft and hard iron magnetometer errors through the co-processing of 3D-magnetometer and 3D-accelerometer data. To build an analytical model for soft and hard iron errors, raw magnetometer data are approximated by a three-dimensional ellipsoid. A general theory for such an approximation is described in, for example, A. R., Shuster M. D. "Complete Linear Attitude-Independent Magnetometer Calibration", The Journal of Astronautical Science, Vol. 50, No. 4, October-December 2002, pp. 477-490 (hereinafter "Shuster"), and I. Markovsky, A. Kukush, S. Van Huffel "Consistent Least Squares Fitting of Ellipsoids", Numer. Math. (2004) 98: 177-194 (hereinafter "Markovsky"). Joint processing is based on the assumption of constancy for a dot product of the Earth's magnetic field vector and gravity field vector, measured by the 3D-magnetometer and 3D-accelerometer, respectively, during calibration rotations of the electronic device. This technique fails when the device under calibration undergoes translational accelerations during calibration rotations. These accelerations are unavoidable during hand-made rotations of the device housing. These accelerations are measured by the 3D accelerometer as a spurious additive vector to the gravity field vector and which violate the dot product constancy condition.

U.S. Pat. No. 8,717,009 to X. Tu describes a calibration of soft and hard iron magnetometer errors due to the recurrent comparison of magnetometer raw vector measurements and reference measurements calculated from an immediate device orientation and previous magnetic heading estimation. This comparison is based on the well-known Kalman filter. In this way, an angular rate sensor serves as an orientation sensor. This technique fails because of the state vector recurrent Kalman filter contains an incomplete list of parameters for soft and hard error calibration. This state vector contains only three parameters for soft iron error calibration. However, a complete list of parameters requires nine parameters for soft iron error calibration.

United States Patent Publication No. 2013/0238268 to H. Sheng describes a technique for magnetometer calibration without additional measurements from inertial sensors. To build an analytical model for soft and hard iron errors, raw magnetometer data are approximated by a three-dimensional ellipsoid. Matrices for calculating calibrated parameters are stored by a recurrent method, and the algorithm produces a full calibration of hard iron errors, while soft iron errors calibration is performed to the accuracy of an arbitrary orthogonal matrix, which will be unknown after the completion of calibration. This uncertainty of the orthogonal part of the soft iron matrix provides completely unknown error in a magnetometer's measurements transformation and the following device attitude determination. As such, this technique fails without application of additional information about the orthogonal matrix.

United States Patent Publication No. 2013/0320963 to C. Tennessee et al. describes a technique for determining continuous zero-offsets in magnetometer measurements based on comparing the tilt angle of the magnet intensity vector measured by the magnetometer and the housing rotation angle obtained by integrating angular rate components measured by a 3D-gyro between subsequent instants of reading magnetometer samples. This technique fails because of hard iron errors are only determined but soft iron errors remain undetermined.

United States Patent Publication No. 2015/0019159 to M. Elgersma et al. describes a technique for a recurrent calibration of a magnetometer, a task of position and orientation determination for an electronic device due to co-processing measurements from the magnetometer and Inertial Measurement Unit (IMU), the latter having a 3D-accelerometer and 3D-gyro. Device orientation is calculated in a navigation coupling filter based on IMU measurements is used for a continuous determination of parameters for soft and hard iron magnetometer errors. The obtained parameters are applied to correct the magnetometer raw measurements, and the magnetic heading is provided as input to the coupling filter as a correction signal. The position computed in the coupling filter is entered into the Earth's magnetic field model to calculate a reference vector of magnetic intensity used in magnetometer calibration. This technique utilizes a the closed-loop architecture, which requires a continuous determination of the device's instant attitude, which is used for continuous magnetometer calibration during the entire interval of device operation. The magnetometer calibration results in turn are used for the continuous attitude determination of the device.

As mentioned above, the above-described techniques have certain inefficiencies with respect to magnetometer calibration, for example, including but not limited to not determining an entire the set of soft iron matrix coefficients, and/or requiring the translational acceleration to be zero and/or requiring a continuous spatial attitude determination of the device.

Therefore, a need exists for an improved technique for calibrating three-axis magnetometers integrated within electronic devices.

BRIEF SUMMARY OF THE INVENTION

In accordance with various embodiments, a calibration method is provided which facilitates a more efficient and routine procedure by calibration of hard and soft iron errors of a 3D-magnetometer integrated into a mobile electronic device, and a set of operations for co-processing measurements of the 3D-magnetometer and inertial sensors (e.g., a 3D-accelerometer and 3D-gyro), which can determine magnetic heading and attitude of the electronic device. In accordance with various embodiments, the method provides for a determination of the entire set of soft iron and hard iron errors parameters without external assistance. Further, the method does not require zero translational acceleration during calibration rotations or continuous instant attitude determination to achieve the desired device calibration.

In an embodiment, the operations utilize particular information collected from a set of sensors including a separate 3D-magnetometer device and MEMS SoC with a 3D-accelerometer and 3D-gyro. These devices are installed, illustratively, as a surface-mounted independent (i.e., self-sufficient) measuring module on a single PCB. In addition to the set of sensors, the module contains a set of microcircuits providing operational modes and adjustment of the sensors, as well as a conversion of raw sensor data into a format suitable for processing by the disclosed operations.

To provide continuous measurements of device attitude, in accordance with the disclosed embodiments, there is a necessity to have geographic coordinate information of the device. These coordinates are used to calculate magnetic declination at an observation point and to convert magnetic heading, measured by the 3D-magnetometer into geographical heading with respect to the North Pole.

In accordance with an embodiment, device attitude within the local frame at the observation point is calculated using a geographic heading and a tilt relative to the local vertical. The right orthogonal reference frame with the well-known East-North-Up (ENU) axes directions is applied as a local frame in one embodiment. Further, geographic coordinates enable the calculation of ENU orientation relative to the Earth's Centered Earth's Fixed (ECEF) coordinate system. ECEF device orientation can be obtained by multiplying the orientation matrix relative to ENU by the orientation matrix relative to ECEF. The information of geographic coordinates can be received from a Global Navigation Satellite System (GNSS) receiver in accordance with an embodiment, and other information sources are also possible, for example, the coordinates can be manually set by the user of the device via a special user interface.

In accordance with an embodiment, the operations facilitate the field calibration for a 3D-magnetometer wherein numerical values of parameters characterizing hard and soft iron errors are determined in the field calibration process. During calibration, in accordance with the embodiment, secondary magnetic fields inside the device are taken to be stationary and slightly changeable in time, and a drift of parameters for the 3D-magnetometer errors model is regarded as negligible.

To perform field calibration, in accordance with an embodiment, a user will find a location that is substantially free from external magnet sources (e.g., power transformers, electric power lines, large-scale electric motors, etc.) and large metal structures. In this scenario, only a sum of the natural Earth's magnetic field and internal magnetic fields inside the device affects magnetometer sensitive elements. Prior to initiating calibration, the geographic coordinates of the device need to be set. As such, in accordance with the embodiment, the true components of the Earth's magnetic vector are determined based on the geographical coordinates and according to a standard model of the Earth's magnetic field. These true components are used for calculating calibrated parameters for the device.

In accordance with an embodiment, magnetometer calibration takes place in two stages with an additional optional third stage. At the first stage, zero offsets of inertial sensors are determined. At the second stage, error model components and parameters of parasitic magnetic field inside the device are determined. The third stage is optional and can be used to additionally specify the calibration results at the second stage.

The second stage of calibration utilizes an arbitrary manual rotation of the device housing. Illustratively, the Earth's magnetic field is taken as a single vector of a permanent direction from the magnetometer's center. When this vector crosses the device housing, it forms an imaginary point. The rotation of the housing (e.g., a receiver housing) is such that the housing would be tightly covered by these imaginary points. In such a rotation, the housing and sensitive elements fixed to the housing rotate about the fixed vector of the external Earth's magnetic field. Further, internal magnetic sources and the magnetic field itself rotate accordingly together with the housing. In this case, vector projections of the internal field on the magnetometer axes do not change, and all changes in measured output values are solely related to turns of the housing relative to the permanent Earth's magnetic vector (the value and direction of which are previously known). By isolating the permanent and changeable components in magnetometer measurements, a determination can be made of the numerical parameters characterizing a model of the device's internal magnetic field.

Numerical parameters cannot be uniquely defined on the basis of magnetometer measurements obtained in calibrating housing rotation due to the mathematics applied to the processing of vector measurements. To unambiguously solve this problem, measurements of the 3D-gyro, defining vector components of receiver's instantaneous angular rate, should be simultaneously processed. Co-processing of two non-collinear vector components allows an unambiguous solution of the model parameter problem for the magnetic field inside the device.

In accordance with an embodiment, the 3D-magnetometer and 3D-gyro are two different micro circuits which are installed onto a PCB of the measuring module independent of each other. Due to permissible inaccuracies in assembling similar sensitivity axes of these vector sensors are non-collinear. The non-collinearity of the axes introduces errors in the magnetic field vector and angular rate components which are to be fixed to the same calculation basis. These inaccuracies result in errors in estimating model parameters for the internal magnetic field at the second calibration stage. Also, possible changes of internal direct currents during the second calibration stage provide additional calibration errors. The third stage of calibration is designed to correct these errors. The device is installed onto a rotation mechanism with a single rotation axis which is mounted onto a stationary tripod/support. The rotation axis is parallel to the local vertical direction.

In accordance with an embodiment, the device is fixed on the rotation axis such that gyro's third orthogonal sensitivity axis would be parallel to the rotation axis. The device produces a few turns about the rotation axis. In this case, the angular rate vector lies on a permanent straight line. The 3D-magnetometer axes rotate in the horizontal plane changing its direction relative to the fixed Earth's magnetic vector.

Ideally, the Z-axis magnetometer indicates a constant value, and a geometric locus of similar measurements in X and Y axes of the magnetometer is a circle with the center in the origin of the coordinates and with a radius equal to the modulo of the Earth's magnetic vector projection onto the horizontal plane. From a comparison of real magnetometer measurements with ideal numerical parameters for the internal magnetic field model considering a sensor frame skew are corrected. The process of calibration is now complete and the device is ready for measuring magnetic heading and determining device attitude.

In accordance with an embodiment, the electronic device can take a diverse orientation in space during service time. If the device is fixed in the process of taking measurements, the magnetic heading can be determined by projections of specific acceleration and the Earth's magnetic field intensity on the coupled axes. Two tilt angles (roll and pitch angles) and the device's magnetic heading are calculated from these two vectors. These three angles are not oriented (i.e., device orientation) relative to any of the Earth's coordinate system, since the magnetic heading is different from geographic course by the magnetic declination angle, for Moscow this angle is 11°, for example. Such a deviation is unacceptable for most applications requiring the device's orientation. A tilt angle relative to the vertical (without horizontal decomposition) is most accurate from the three angles.

If at an instant of measuring magnetic heading, the device's geographic coordinates are known, the orientation operations can compute a local magnetic declination angle with the help of a standard Earth's magnet field model and correct orientation angles. After the correction is done, the magnetic heading becomes the geographic one, and magnetic pitch and roll angles geographic angles. The value of the measured tilt angle does not change, since the correction is, in fact, a rotation of the sensor frame about the vertical axis by the magnetic declination angle.

If the device housing is rotated relative to a fixed center with constant coordinates within the device Body Frame (BF) at the moment of measuring, then accelerometer measurements includes centripetal acceleration components. This acceleration is great enough to introduce an inaccuracy of several degrees. The centripetal accelerations are corrected by 3D-gyro measurements and the known coordinates of the fixed center of rotation.

These and other advantages of the embodiments will be apparent to those of ordinary skill in the art by reference to the following detailed description and the accompanying drawings.

DETAILED DESCRIPTION

In accordance with various embodiments, a calibration method is provided which facilitates a more efficient and routine procedure by calibration of hard and soft iron errors of a 3D-magnetometer integrated into a mobile electronic device, and a set of operations for co-processing measurements of 3D-magnetometer and inertial sensors (e.g., a 3D-accelerometer and 3D-gyro), which can determine magnetic heading and attitude of the electronic device.

Figure 1:
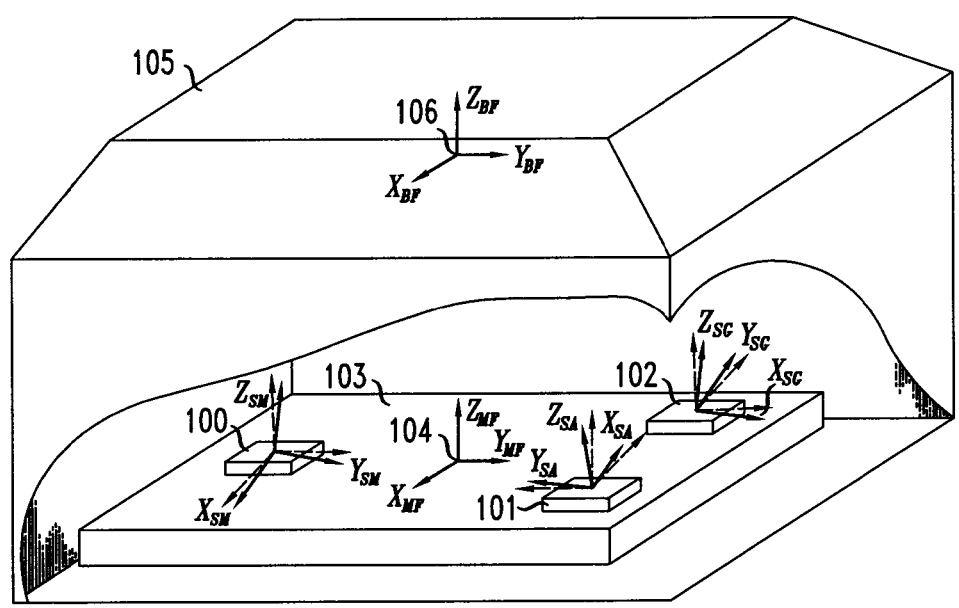
FIG. 1 shows a distribution of sensor frames inside an electronic device and correlations between them.

FIG. 1 shows a distribution of sensor frames inside an electronic device and correlations between them. In particular, sensitivity axes of each vector sensor (e.g., a 3D-magnetometer, 3D-accelerometer or 3D-gyro) are almost mutually perpendicular and form sensor frames (SF) $x_{Si}$, $y_{Si}$, $z_{Si}$, where: i=M, A, G. "M" corresponds to SF 100 of 3D-magnetometer, "A"—SF 101 of the accelerometer, "G"—SF 102 of the gyro, as shown in FIG. 1, and bar arrows show directions of the sensitivity axes for ideal sensor frames.

Typically, such sensors are produced in the form of microchips suitable for surface mounting, for example, on PCB 103. In this case, the following SF axes orientation is commonly used: axis $z_{Si}$ is perpendicular to the chip package surface, i.e., perpendicular to the surface of PCB 103 on which this chip is mounted. Axes $x_{Si}$, $y_{Si}$, are perpendicular to axis $z_{Si}$ and pass through the chip's lateral side, i.e., lie in the PCB 103 plane, and the SF axes, in particular, form a right orthogonal triad as shown in FIG. 1.

When designing a measuring module, an arbitrary orientation of axes $x_{Si}$, $y_{Si}$ is allowed for single sensors relative to the PCB edges, for example, PCB 103 edges. For co-processing, measurements from all sensitivity axes are algorithmically transformed to common right orthogonal frame 104 of a Measurement Frame (MF) which has been coordinated with any PCB natural mechanical references (for example, edges).

The housing of electronic device 105 is tightly coupled to the right orthogonal Cartesian coordinate system 106 of a Body Frame (BF). BF axes directions are selected from the mechanical design and features of using the device by the end user. As a rule, the axis BF in service is oriented up (or down) and is designated as $z_{BF}$. The other two axes are designated $x_{BF}$ and $y_{BF}$, respectively. MF orientations relative to BF are constant and determined by the design of the associated electronic device. In order to successfully solve user tasks, all sensor measurements obtained in MF are transformed to BF.

In terms of linear approximation, output values of the vector sensor i=M, A, G are as follows:

$$z_{Si} = \text{diag}\left[\frac{1}{k_{xi} - \delta k_{xi}}, \frac{1}{k_{yi} - \delta k_{yi}}, \frac{1}{k_{zi} - \delta k_{zi}}\right](S_{Si}^{BF} x_{BF} + \hat{b}_i + \hat{\xi}_i), \quad (1)$$

where: $z_{Si}$ is the dimensionless digital code read from the output of the corresponding vector sensor; $x_{BF}$ are the true projections of the measured vector $\vec{x}$ onto BF of the electronic device; $k_{ji}$, $\delta k_{ji}$, j=x, y, z are the nominal values and errors of scaling factors for the sensitivity elements of the vector sensor; $S_{Si}^{BF}$ is the matrix of re-projection of vector $x_{BF}$ onto skew frame formed by sensor sensitivity axes; $\hat{b}_i$ is the vector of almost constant zero offsets for the sensor sensitivity elements; and $\hat{\xi}_i$ is the vector of random errors and noise in the sensor sensitivity elements.

Numerical values of attitude parameters of a single SF relative to BF are the same and calculated from mechanical drawings or measured in factory calibration in the form of transformation matrix $M_{BF}^{Si}$. In addition to parameters of mutual orientation for the sensitivity axes, this matrix includes scaling factors of the sensitivity elements converting dimensionless digital codes into dimensional quantities:

$$M_{BF}^{Si}=S_{BF}^{Si}\mathrm{diag}[k_{xi},k_{yi},k_{zi}].$$

A conversion of digital codes being read from the vector sensor to dimensional quantities being projected onto BF is made by multiplication of vector $z_{Si}$ by the corresponding matrix $M_{BF}^{Si}$:

$$y_{BF}=M_{BF}^{Si}z_{Si}\approx \mathrm{diag}[1+\delta\rho_{xi},1+\delta\rho_{yi},1+\delta\rho_{zi}]x_{BF}+\tilde{b}_i+\tilde{\xi}_i, \quad (2)$$

where: $\delta\rho_{xi}=\delta k_{ji}/k_{ji}$ is the relative error of the scale factor; $\tilde{b}_i$, $\tilde{\xi}_i$ are equivalent values of sensor zero offsets and random noise obtained from $\hat{b}_i$, $\hat{\xi}_i$ after substitution of equation (1) in equation (2).

After conversion pursuant to equation (2) has been completed and before further measurement processing, numerical values of these measurement components are verified. The verification can include a comparison of the obtained results with expected ones, median filtering as well as some other algorithms for stream verification of input data as is well-known in digital signal processing. Based on verification results, a decision is reached about their use in further processing. If the verification failed, the obtained measurement vector is rejected. If the numerical values pass, the converted vector is fed to the input of the device's orientation algorithms and/or magnetometer calibration algorithms. Determination of the number and the rate of faulty measurements and a response method to obtained failure statistics is governed by the resident operating system of the associated electronic device.

Figure 2:
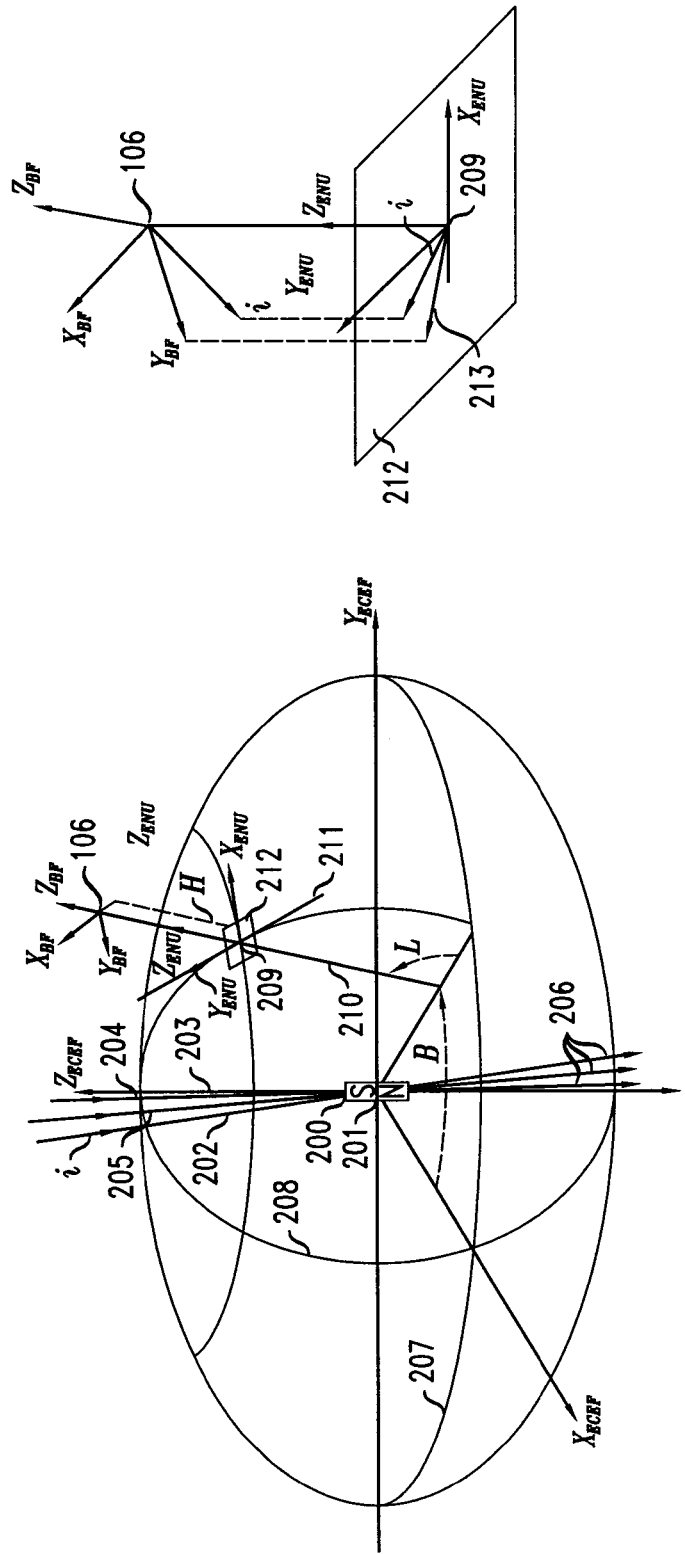
FIG. 2 shows an illustrative diagram of the Earth's magnetic field near the ground and relative coordinate systems used in the embodiments herein.

FIG. 2 shows an illustrative diagram of the Earth's magnetic field near the ground and relative coordinate systems used in the embodiments herein. As shown, the Earth's magnetic field is approximately assumed to be induced by permanent magnetic dipole 200, the center of which is in the Earth's geometric center 201. Dipole longitudinal axis 202 does not match Earth's rotation axis 203, and points wherein dipole axis 202 intersects the Earth's surface are called Earth's Magnet Poles. In particular, the magnetic pole close to north geographic pole 204 is called North Magnetic Pole 205, and since magnetic axis 202 is tilted relative to Earth's rotation axis 203, the positions of north geographic pole 204 and the North Magnetic Pole 205 do not match. In a similar fashion, the South Magnetic Pole is defined. It should be noted, in FIG. 2, that North Magnetic Pole 205 is in fact the south pole of magnetic dipole 200, and South Magnetic is the north pole of the magnetic dipole.

The Earth's magnetic field is depicted in the form of magnetic lines of force 206. Magnetic lines are built such that magnetic field intensity vector $\vec{H}$ at any point in the vicinity of the ground surface would be a tangential vector to the magnetic line through this point. The length of the tangential vector is equal to the intensity of the magnetic field at the given point. Magnetic lines through North and South Poles coincide with longitudinal axis 202 of magnetic dipole 200. Vector $\vec{H}$ at North Magnetic Pole 205 (which is in fact the south pole of the dipole) is strictly directed to the Earth's center along magnet dipole 200. Vector $\vec{H}$ at South Magnetic Pole (which is in fact the north pole of the dipole) is strictly directed from the Earth's center along magnet dipole 200 such that magnetic lines of the Earth's originate from South Magnetic Pole and converge in North Magnetic Pole 205.

To define coordinates of the electronic device, two coordinate systems—geographic and geocentric can be used relative to the ground surface. Geographic coordinates are assigned as latitude B, longitude L, and altitude H over the Earth's ellipsoid. Geocentric coordinates—Earth's Centered Earth's Fixed (ECEF)—are defined relative to the right orthogonal Cartesian coordinate system with its origin in the Earth's center. Axis $z_{ECEF}$ coincides with Earth's rotation axis 203, axis $x_{ECEF}$ comes from the Earth's center and goes through the point of intersecting equator 207 and Greenwich meridian 208. Axis $y_{ECEF}$ supplements the system to the right orthogonal system. ECEF coordinate system is widely used in GNSS equipment and associated standards as will be readily understood by those skilled in the art.

A spatial orientation of the device housing is the orientation of the associated BF 106 relative to the ECEF. In the vicinity of the ground surface there are no geophysical fields uniquely coupled with ECEF axes, hence a direct orientation of the electronic device relative to the ECEF with integrated sensors is impossible. Instead, BF orientation is determined relative to the so-called local coordinate system (Local Frame) 209, whose orientation relative to the ECEF can be readily calculated from geographic coordinates of the device. BF orientation 106 as to ECEF is obtained by a calculation sequentially considering the measured BF 106 relative to LF 209 and calculated orientation LF 209 relative to ECEF. Further, LF 209 is determined by two non-parallel lines intersecting at the origin of BF 106. One line 210 is perpendicular to the Earth's ellipsoid, matches the vertical line and called the local vertical. The second line 211 is tangential to the meridian through the point of intersecting line 210 and the Earth's ellipsoid.

In accordance with an embodiment, LF East-North-Up (ENU) is used wherein axis $z_{ENU}$ is directed up along local vertical 210, axis $y_{ENU}$ is directed to the north geographical pole 204 along the tangential to meridian 211, and axis $x_{ENU}$ supplements the system to the right orthogonal one and is directed to the East. Axes $x_{ENU}$ and $y_{ENU}$ lie in plane 212 (also referred to as the local horizon plane) tangential to the surface of the Earth's ellipsoid at the LF 209 coordinate origin.

The orientation of BF 106 relative to LF 209 is assigned by conventional methods of orienting one right orthonormal frame relative to another and using a directional cosine matrix, quaternion coefficients, different systems of Euler angles and so on. In one of the embodiments herein, where BF orientation 106 relative to LF 209, ENU being served as LF, is assigned by an Euler angle system describing a sequence of turns $Z \rightarrow X \rightarrow Y$ and consisting of geographical heading, geographical pitch $\theta$ and geographical roll $\gamma$. The following matrix of directional cosines corresponds to this angle system:

$$S_{ENU}^{BF} = \begin{Vmatrix} c_\psi c_\gamma - s_\psi s_\theta s_\gamma & -s_\psi c_\theta & c_\psi s_\gamma + s_\psi s_\theta c_\gamma \\ s_\psi c_\gamma + c_\psi s_\theta s_\gamma & c_\psi c_\theta & s_\psi s_\gamma - c_\psi s_\theta c_\gamma \\ -c_\theta s_\gamma & s_\theta & c_\gamma c_\theta \end{Vmatrix}$$

where: $c_i=\cos(i)$, $s_i=\sin(i)$, $i=\psi, \theta, \gamma$.

Further, the orientation of LF 209 relative to ECEF is calculated from geographical coordinates B, L, H of the origin of BF 106 in the form of the matrix of directional cosines. For one of the embodiments herein wherein ENU is used as LF this matrix of directional cosines is as follows:

$$S_{ECEF}^{ENU} = \begin{Vmatrix} -\sin L & -\cos L \sin B & \cos L \cos B \\ \cos L & -\sin L \sin B & \sin L \cos B \\ 0 & \cos B & \sin B \end{Vmatrix}. \quad (3)$$

For this embodiment, the orientation of BF 106 relative to ECEF is calculated as a matrix of directional cosines:

$$S_{ECEF}^{BF} = S_{ECEF}^{ENU} S_{ENU}^{BF}.$$

Projection $\vec{H}_\tau$ of vector $\vec{H}$ taken at the origin of BF 106 onto the plane of local horizon 212 is directed to North Magnetic Pole 205. Angle $\psi_M$ between vector $\vec{H}_\tau$ and orthogonal projection 213 onto axis $\gamma_{BF}$ in local horizon 212 is called the magnetic heading of a device. At the magnetic poles (i.e., North Magnetic Pole and South Magnetic Pole, also referred to herein collectively as "Magnetic Poles"), vector $\vec{H}_\tau$ is identically equal to the zero vector, hence the definition of "magnetic heading" has little meaning at the Magnetic Poles. Components of vector $\vec{H}_\tau$ in the vicinity of Magnetic Poles are slightly different from zero which results in large errors in determination of the magnetic heading which contributes to the definition of special restrictions for using magnetic devices over 75° North latitude and 75° South latitude, as will be appreciated by those skilled in the art.

The angle between vector $\vec{H}_\tau$ and vector $\gamma_{ENU}$, the absolute value of which is the difference $\Delta\psi=\psi-\psi_M$ between geographic and magnetic headings, is the so-called magnetic declination. The magnetic declination can be large (e.g., in Moscow this magnitude is 11°) and should be considered in calculating geographic heading $\psi$ from magnetic measurements.

For example, the true vector $\vec{H}$ of the Earth's magnetic field intensity at the magnetometer point is defined by column $H_{ECEF}$ ECEF coordinates. Numeric values of these components of vector $\vec{H}$ are determined only by the device's geographic coordinates and do not depend on its orientation. The components $H_{BF}$ of vector $\vec{H}$ in BF are expressed as column $H_{ECEF}$ and the orthogonal matrix $S_{BF}^{ECEF}$ specific for orientation of the device relative to ECEF: $H_{BF}=S_{BF}^{ECEF}H_{ECEF}$. The numeric values of components of column $H_{BF}$ depend on the orientation of the device and change when it turns.

Generally, there are different magnetic sources (e.g., electric conductors, transformers, and magnetized design elements) inside the electronic device around sensitive elements associated with the resident 3D-magnetometer. Equivalent extraneous magnetic field induced by all these elements is described by vector $J_{BF}$. Column elements $J_{BF}$ do not depend on the device's orientation, since magnetic field $J_{BF}$ is tightly coupled with the housing and rotated together with it. Inside the device, vector $J_{BF}$ is added to the vector of external magnetic field $H_{BF}$. Additive distortions such as $J_{BF}$ induced by the sources of permanent magnetic field inside an electronic device (i.e., hard iron errors irrespective of their nature).

A sum of magnetic fields $H_{BF}+J_{BF}$ affects the metallic housing with the 3D-magnetometer inside, as well as other magnetic-sensitive elements of the device. Under the influence of the magnetic field these elements generate their own magnetic field which subsequently disappear when the exciting magnetic field is removed. The action of such a field is expressed as a vector of magnetic induction $B_{BF}$, the magnitude and direction of which is different from the sum of $H_{BF}+J_{BF}$ near magnetometer's measurement center:

$$B_{BF}=\hat{M}(H_{BF}+J_{BF})=\hat{M}H_{BF}+\hat{M}J_{BF}. \quad (4)$$

Matrix $\hat{M}$ is a matrix of magnetic permeability near the 3D-magnetometer. Measurement errors of the magnetic field vector are soft iron errors and described by multiplying the measured vector by the matrix of magnetic permeability. Numeric values of components for matrix $\hat{M}$ are almost constant and do not depend on the device's orientation.

Composite magnetic field described by vector $B_{BF}$ affects the sensitive elements of 3D-magnetometer. Expressions for magnetometer measurements used in the algorithms described can be obtained by substituting equation (4) in equation (2):

$$\mu_{BF}=\text{diag}[1+\delta\rho_{xM},1+\delta\rho_{yM},1+\delta\rho_{zM}]B_{BF}+\tilde{b}_M+\tilde{\xi}_M = M^{-1}H_{BF}+b_M+\tilde{\xi}_M,$$

where: $M^{-1}=\text{diag}[1+\delta\rho_{xM},1+\delta\rho_{yM},1+\delta\rho_{zM}]\tilde{M}$ is the equivalent soft iron error matrix; $b_M=M^{-1}J_{BF}+\tilde{b}_M$ is the equivalent hard iron error vector.

The aim of the magnetometer calibration in accordance with the various embodiments herein is to determine numerical values of components for an equivalent soft iron error matrix M and equivalent vector $b_M$. To do this, magnetic permeability matrix is presented in the form of polar decomposition $M^{-1}=D^{-1}U^T$, where $D^{-1}$ is the symmetric 3×3 matrix, $U^T$ is the orthogonal 3×3 matrix. This decomposition is well-known in matrix algebra. The final model for 3D-magnetometer measurements is as follows:

$$\mu_{BF}=(D^{-1}U^T)S_{BF}^{ECEF}H_{ECEF}+b_M+\tilde{\xi}_M. \quad (5)$$

Figure 3:
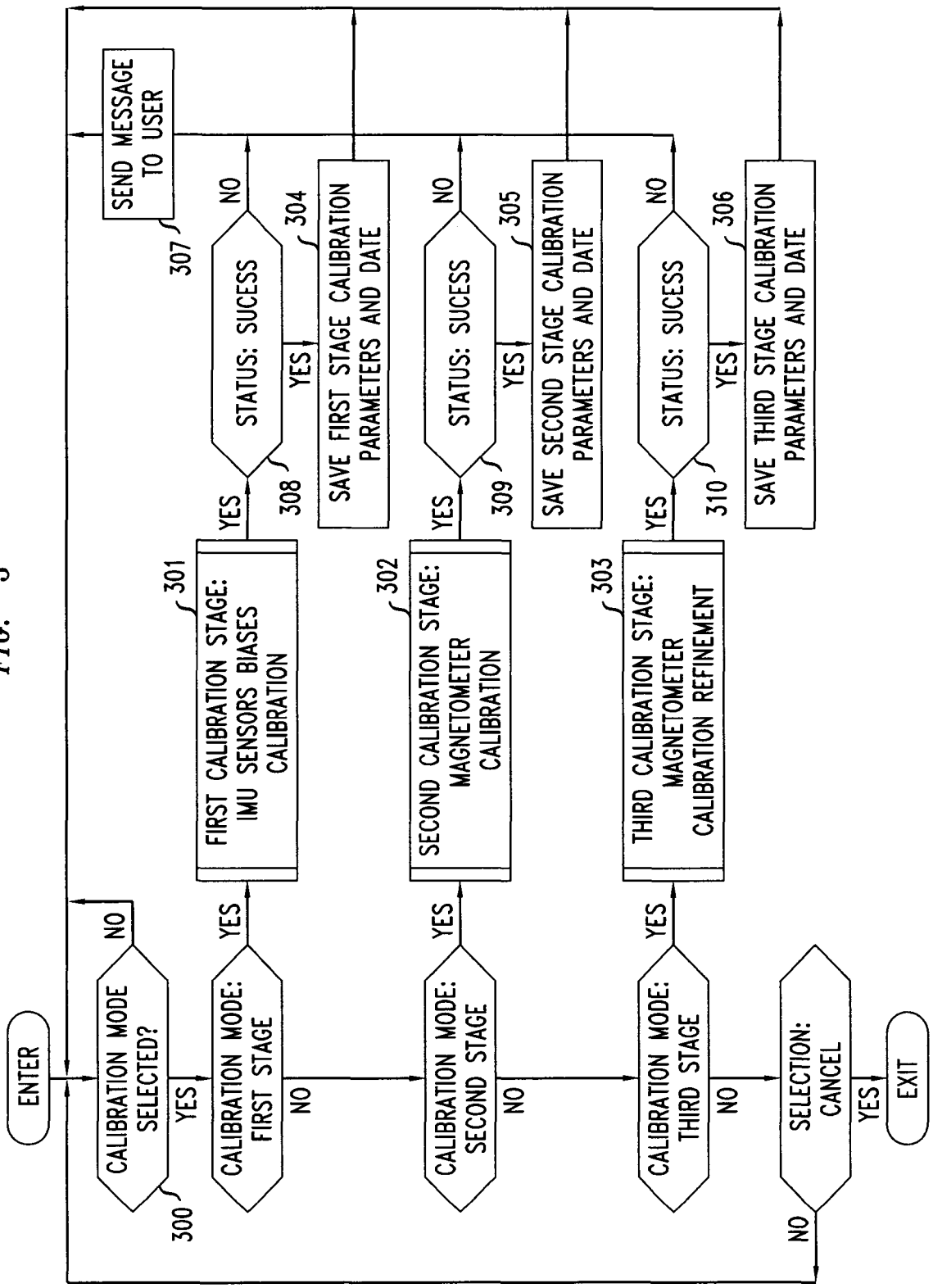
FIG. 3 shows a flowchart of illustrative operations for field calibration of a 3D-magnetometer in accordance with an embodiment.
Figure 4:
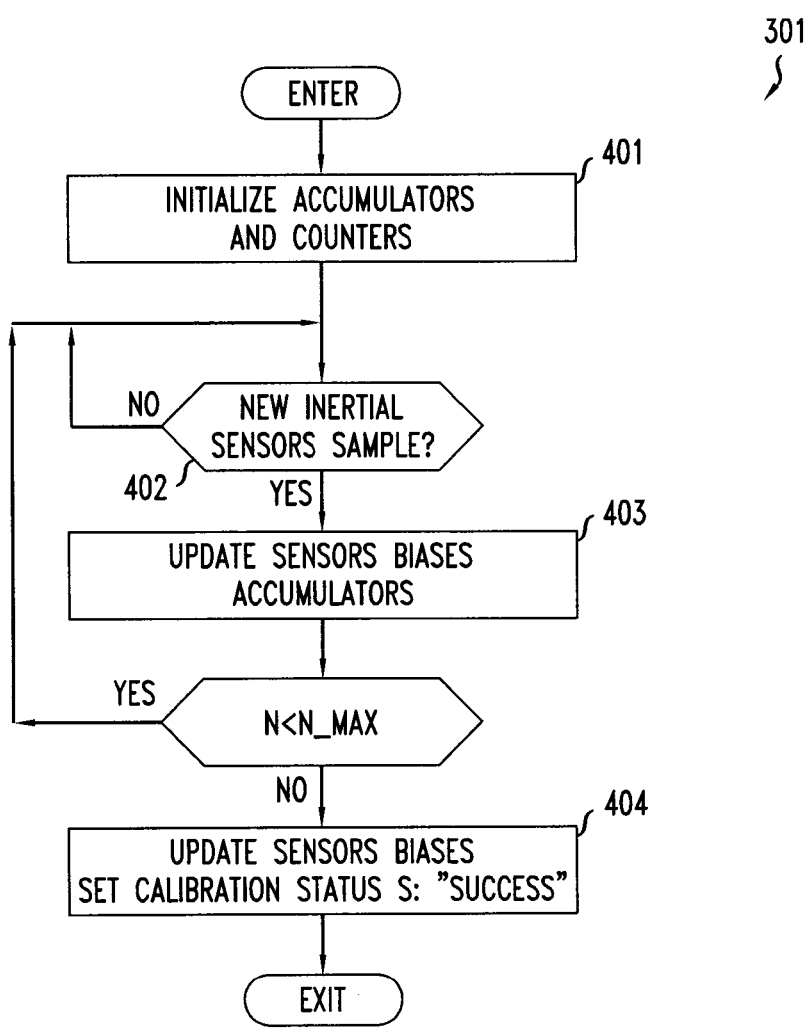
FIG. 4 shows a flowchart of illustrative operations for the first calibration stage of FIG. 3 in accordance with an embodiment.
Figure 5:
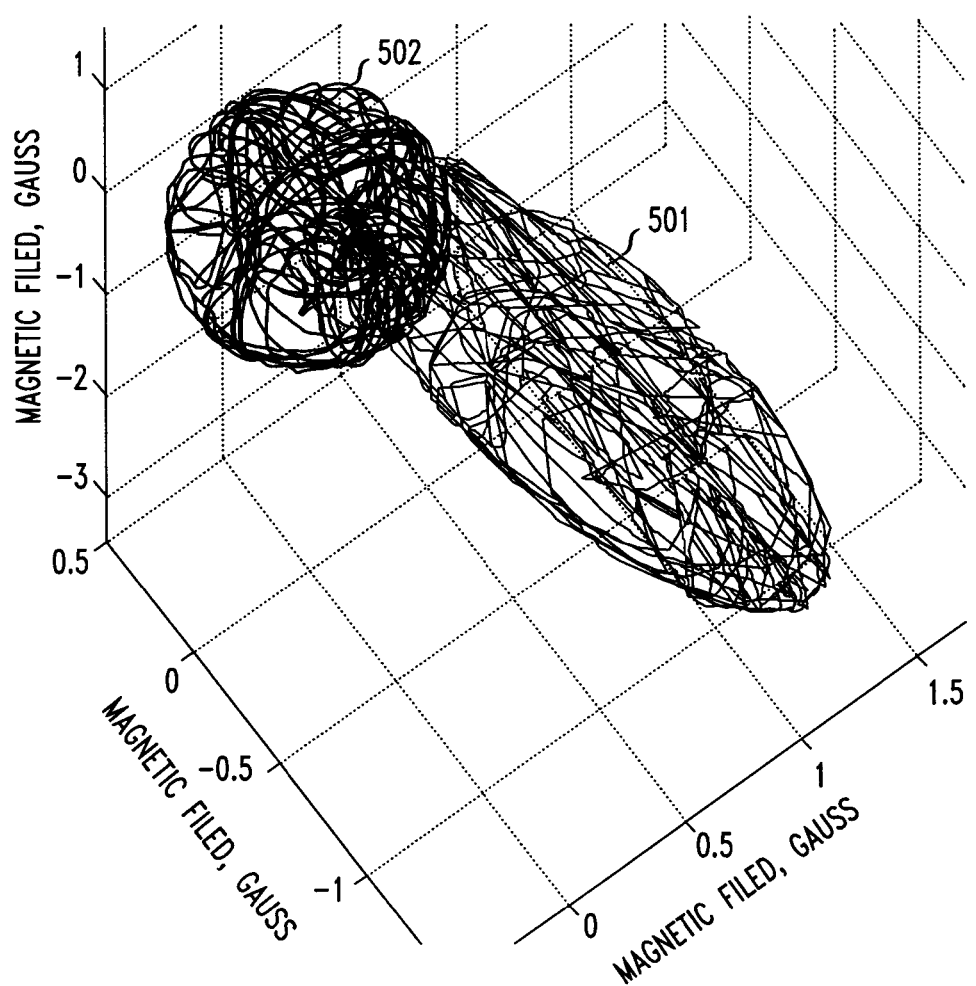
FIG. 5 presents an illustrative diagram of the geometric locus of magnetometer measurements obtained in calibration rotation before and after the second calibration stage in accordance with an embodiment.

FIG. 3 shows a flowchart of illustrative operations for field calibration of a 3D-magnetometer in accordance with an embodiment. As shown, each calibration stage 300 can be chosen separately of others. At the first stage 301, vectors $b_A$ and $b_G$ of zero offsets for 3D-accelerometer and 3D-gyro within the measuring module are calibrated. As further discussed herein below, FIG. 4 shows a flowchart of illustrative operations for the first calibration stage (i.e., first stage 301 shown in FIG. 3) in accordance with an embodiment. At the second stage 302, the matrix of magnetic permeability M and zero offset vector $b_M$ (soft and hard iron calibration) are calibrated. Matrices D and U are separately determined—matrix D first, and then matrix U. As further discussed herein below, FIG. 5 shows an illustrative diagram of the geometric locus of magnetometer measurements obtained in calibration rotation before and after the second calibration stage in accordance with an embodiment.

Figure 6:
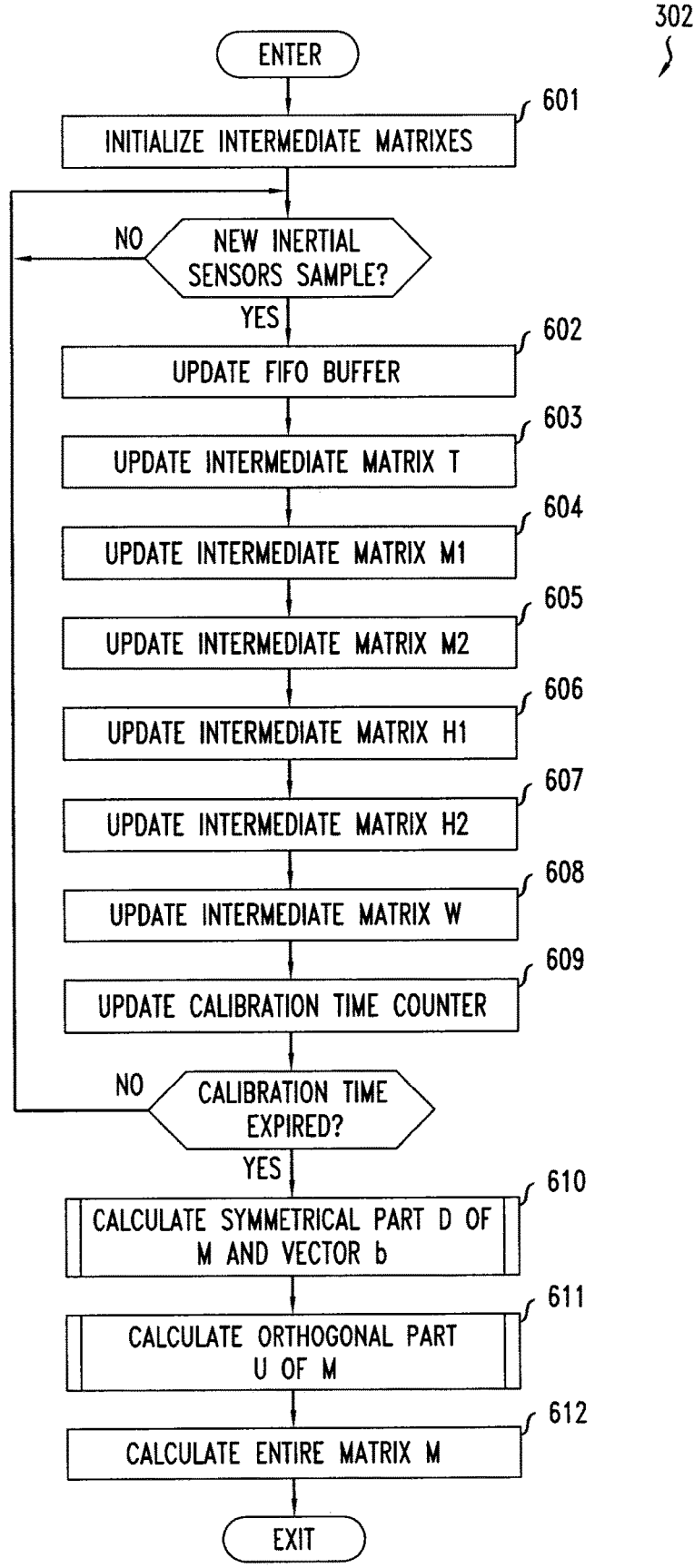
FIG. 6 shows a flowchart of illustrative operations for the second calibration stage of FIG. 3 in accordance with an embodiment.

At the third stage 303, an additional correction of calibration errors for M and $b_M$ is produced. As further discussed herein below, FIG. 6 shows a flowchart of illustrative operations for the second calibration stage (i.e., second stage 302 shown in FIG. 3) in accordance with an embodiment. Upon completion of each stage, the calibration status, returnable by the corresponding calibration algorithm, is checked. If the first stage has completed without errors (Success status at step 308), the date and time 304 of executing the first stage are recorded in the device; $b_A$ and $b_G$ (zero offsets of inertial sensors) are updated by new values obtained in calibration.

If the second stage completes without errors (i.e., Success status at step 309), the date and time, at step 305, of executing the second stage are recorded in the device; and new values of M and $b_M$ obtained at the second stage are stored. If the third stage completes without errors (i.e., Success status at step 310), the date and time, at step 306, of executing the third stage are recorded in the device and new values of M and $b_M$ obtained at the third stage are stored. After the chosen calibration stage completes, the algorithm returns to waiting for the user's choice 300. If any calibration stage completed with errors (i.e., the status is different from Success status), parameters calibrated at this stage do not change, and the date and time of executing this stage do not change. At step 307, the message is sent to the user describing a calibration stage and features of the error status.

FIG. 4 shows a flowchart of illustrative operations for the first calibration stage (i.e., first stage 301 shown in FIG. 3) in accordance with an embodiment. Before running the first calibration stage the electronic device is mounted on a fixed rod such that axis $z_{BF}$ would be up. After the first calibration stage runs, initialization, at step 401, of two vector registers, 3×1 each, begins to store vector measurements of the 3D-accelerometer $r_A = \|0\ 0\ 0\|^T$ and 3D-gyro $r_G = \|0\ 0\ 0\|^T$ and the counter of vector measurements from inertial sensors N=0 resets. A restrictive timer to limit the duration of calibration is also executed.

After initialization step 401, the operations execute, at step 402, waiting for a next pair of vector measurements $n_{BF}$ from accelerometer and $\omega_{BF}$ from gyro converted from raw measurements of the corresponding sensors according to equation (2). When the next pair of vector measurements has arrived, accumulators are updated, at step 403, to estimate zero offsets of these sensors:

$$r_G = r_G + \omega_{BF}, r_A = r_A + n_{BF}.$$

The counter of stored measurements is incremented in the same process: N=N+1.

If the number of stored measurements is smaller than the pre-set value N_max, the operations return to listening to a next vector pair. Otherwise, the operations move to calculating zero offsets of inertial sensors.

A calculation of zero offsets for inertial sensors, at step 404, is made in the form of mathematical expectation of the stored measurements:

$$b_G = \frac{r_G}{N} = \frac{1}{N}\sum_{i=1}^{N} \omega_{BFi},$$

$$b_A = \frac{r_A}{N} - \|0\ 0\ g\|^T = \frac{1}{N}\sum_{i=1}^{N} n_{BFi} - \|0\ 0\ g\|^T,$$

where: g is the absolute value of the free fall acceleration at the point of the electronic device.

Calibration status S is also set in the state of "Success calibration", after that the first calibration stage 301 is over. The results of executing the operations in accordance with the embodiment is the calibration status S and zero offsets $b_G$, $b_A$.

The second stage 302, in accordance with an embodiment, should be executed far from large metal objects or magnetic field sources (e.g., power lines, electric engines, transformers etc.). To perform the second stage, the user needs to specially rotate the housing of the electronic device. To describe this rotation, it is helpful to present the Earth's magnetic vector $\vec{H}$ led from the origin of BF 106. The direction of this vector at the given point is constant relative to Earth's and does not depend on the device's orientation. Intersecting the outer surface of the housing, this vector depicts an imagined point on it. The user should rotate the housing such that the whole housing surface would be painted by such imagined points.

FIG. 5 shows an illustrative diagram of the geometric locus of magnetometer measurements obtained in calibration rotation before and after the second calibration stage 302 in accordance with an embodiment. At such an image mode each vector measurement $\mu = \|\mu_1\ \mu_2\ \mu_3\|^T$ read from 3D-magnetometer is depicted as a point with coordinates $(\mu_1, \mu_2, \mu_3)$ in the Cartesian orthogonal coordinate system. If the magnetometer measurements were ideal, the geometric locus would be a sphere with the origin at zero and a radius equal to magnetic intensity at the given point. However, due to external and internal inaccuracies, the geometric locus of real measurements is a 3D-ellipsoid 501 (matrix M is responsible for its shape) shifted relative to the coordinate origin (vector $b_M$ is responsible for shifting). After matrix M and vector $b_M$ have been taken into account at the second calibration stage 302, the geometric locus of the real measurements is transformed into spherical object 502 with the center in the coordinate origin.

A block-diagram of the operations for the second stage 302 is shown in FIG. 6. Before calibration rotation starts, initialization, at step 601, of intermediate matrices is done which includes filling in zeros in the following data arrays:

matrix T in the form of a row of 1×55 elements;
matrix $M_1$—two-dimensional 3×9 data array;
matrix $M_2$—two-dimensional 3×3 data array;
matrix $H_1$—two-dimensional 6×6 data array;
matrix $H_2$—two-dimensional 6×3 data array;
matrix W—a row of 1×6 elements.

Vector measurements of 3D-magnetometer and 3-D gyro are read and verified during calibrating rotation of the housing. Once next vector measurement from 3D-magnetometer and the vector measurement from 3D-gyro arrive, FIFO buffers, at step 602, for scalar components of the vector measurements are updated:

$$\mu_{i,k-1} \Leftarrow \mu_{i,k}, \omega_{i,k-1} \Leftarrow \omega_{i,k}$$

$$\mu_{i,k} \Leftarrow \mu_i, \omega_{i,k} \Leftarrow \omega_i - b_{iG}, i=1,2,3$$

where: $\mu_{i,k}$, $\omega_{i,k}$ are the latest scalar measurements from the sensitivity axis i=1, 2, 3 for 3D-magnetometer and 3D-gyro placed into FIFO; $\mu_{i,k-1}$, $\omega_{i,k-1}$ are the previous measurements placed into FIFO; $b_{iG}$ are the vector components for zero offsets $b_G = \|b_{1G}\ b_{2G}\ b_{3G}\|^T$.

Data from FIFO are used for recurrent updating of the intermediate matrices. Symmetrical matrix T is updated in 603 according to the following:

$$T = T + \begin{Vmatrix} q_1 & s_1s_2 & s_1s_3 & r_1t_2 & r_1t_3 & s_1t_2t_3 & r_1 & s_1t_2 & s_1t_3 & s_1 \\ & q_2 & s_2s_3 & t_1r_2 & t_1s_2t_3 & r_2t_3 & t_1s_2 & r_2 & s_2t_3 & s_2 \\ & & q_3 & t_1t_2s_3 & t_1r_{3k} & t_2r_3 & t_1s_3 & t_2s_3 & r_3 & s_3 \\ & & & s_1s_2 & s_1t_2t_3 & t_1s_2t_3 & s_1t_2 & t_1s_2 & t_1t_2t_3 & t_1t_3 \\ & & & & s_1s_3 & t_1t_2s_3 & s_1t_3 & t_1t_2t_3 & t_1s_3 & t_1t_3 \\ & & & & & s_2s_3 & t_1t_2t_3 & s_2t_3 & t_2s_3 & t_2t_3 \\ & & & & & & s_1 & t_1t_2 & t_1t_3 & t_1 \\ & & & & & & & s_2 & t_2t_3 & t_2 \\ & & & & & & & & s_3 & t_3 \\ & & & & & & & & & 1 \end{Vmatrix}$$

where: $q_i = \mu_{i,k-1}^4 - 6\sigma_i^2\mu_{i,k-1}^2 + 3\sigma_i^4$, $r_i = \mu_{i,k-1}^3 - 3\sigma_i^2\mu_{i,k-1}$, $s_i = \mu_{i,k-1}^2 - \sigma_i^2$, $t_i = \mu_{i,k-1}$, i=1, 2, 3; $\sigma_i$ is the RMS of random errors $\xi_{iM}B(3)$, $\xi_M = \|\xi_{1M}\ \xi_{2M}\ \xi_{3M}\|^T$.

Matrix $M_1$ is updated in 604 according to the following:

$$M_1 = M_1 + \begin{Vmatrix} M_1^{111} & M_1^{112} & M_1^{113} & M_1^{121} & M_1^{122} & M_1^{123} & M_1^{131} & M_1^{132} & M_1^{133} \\ M_1^{211} & M_1^{212} & M_1^{213} & M_1^{221} & M_1^{222} & M_1^{223} & M_1^{231} & M_1^{232} & M_1^{233} \\ M_1^{211} & M_1^{312} & M_1^{313} & M_1^{321} & M_1^{322} & M_1^{323} & M_1^{331} & M_1^{332} & M_1^{333} \end{Vmatrix},$$

$$M_1^{qij} = \omega_{q,k-1}\mu_{i,k-1}(\mu_{j,k} - \mu_{j,k-1}),$$

$$q, i, j = 1, 2, 3.$$

Matrix $M_2$ is updated in 605 according to the following formula:

$$M_2 = M_2 + \begin{Vmatrix} M_2^{11} & M_2^{12} & M_2^{13} \\ M_2^{21} & M_2^{22} & M_2^{23} \\ M_2^{31} & M_2^{32} & M_2^{33} \end{Vmatrix},$$

$$M_2^{ij} = \omega_{i,k-1}(\mu_{j,k} - \mu_{j,k-1}),$$

$$i, j = 1, 2, 3..$$

Matrix $H_1$ is updated in 606 according to the following:

$$H_1 = H_1 + \begin{Vmatrix} H_1^{1111} & H_1^{1112} & H_1^{1113} & H_1^{1122} & H_1^{1123} & H_1^{1133} \\ H_1^{1211} & H_1^{1212} & H_1^{1213} & H_1^{1222} & H_1^{1223} & H_1^{1233} \\ H_1^{1311} & H_1^{1312} & H_1^{1313} & H_1^{1322} & H_1^{1323} & H_1^{1333} \\ H_1^{2211} & H_1^{2212} & H_1^{2213} & H_1^{2222} & H_1^{2223} & H_1^{2233} \\ H_1^{2311} & H_1^{2312} & H_1^{2313} & H_1^{2322} & H_1^{2323} & H_1^{2333} \\ H_1^{3311} & H_1^{3312} & H_1^{3313} & H_1^{3322} & H_1^{3323} & H_1^{3333} \end{Vmatrix},$$

where: $H_1^{ijqm} = \omega_{ik-1}\omega_{jk-1}\mu_{qk-1}\mu_{mk-1}$, $i, j, q, m = 1, 2, 3$.

Matrix $H_2$ is updated in 607 according to the following formula:

$$H_2 = H_2 + \begin{Vmatrix} H_2^{111} & H_2^{112} & H_2^{113} \\ H_2^{121} & H_2^{122} & H_2^{123} \\ H_2^{131} & H_2^{132} & H_2^{133} \\ H_2^{221} & H_2^{222} & H_2^{223} \\ H_2^{231} & H_2^{232} & H_2^{233} \\ H_2^{331} & H_2^{332} & H_2^{333} \end{Vmatrix}, H_2^{ijq} = \omega_{i,k-1}\omega_{j,k-1}\mu_{q,k-1}.$$

Matrix W is updated in 608 according to the following formula:

$$W = W + \|\omega_{11}\omega_{12}\omega_{12}\omega_{22}\omega_{23}\omega_{33}\|, \omega_{ij} = \omega_{ji} = \omega_{i,k-1}\omega_{j,k-1}.$$

The completing instant of storing the intermediate matrices is defined by the value in the increasing counter/timer 609 that counts time of executing the calibrating rotation. Upon completion of storing the intermediate matrices, the operations stop to read new measurements from the magnetometer and gyro and moves to calculating offset vector 610 $b_M$ and a symmetrical part D of the polar decomposition of matrix M. Calibrating rotation can be terminated.

When the algorithm receives the symmetrical part D, it proceeds to determination of an orthogonal part U 611 and a final calculation of matrix 612 M in accordance with:

$$M = UD$$

A calculation of the symmetrical part D for the magnetic conductivity matrix is based on a linear approximation of ellipsoid 501. A full description of the theory can be found in Shuster and Markovsky, respectively. The main idea of approximation is in a representation of permanent vector $H_{ECEF}$ with known components in the form of an affine transformation dependent on the measured vector μ:

$$H_{ECEF} = M(\mu - b_M) = UD(\mu - b_M).$$

A scalar multiplication product of this representation by itself gives a quadratic form:

$$H^2 = (H_{ECEF})^T H_{ECEF} = (\mu - b_M)^T D^T D(\mu - b_M) = (\mu - b_M)^T Q (\mu - b_M), \tag{6}$$

where: $H = |H_{ECEF}|$ is the Earth's magnetic intensity at the point of magnetometer calibration;

$$Q = D^T D = DD = \begin{Vmatrix} q_{11} & q_{12} & q_{13} \\ q_{12} & q_{22} & q_{23} \\ q_{13} & q_{23} & q_{33} \end{Vmatrix},$$

at this $q_{11} > 0$, $q_{22} > 0$, $q_{33} > 0$.

Equation (6) can be written as an equation approximately valid for each magnetometer measurement μ:

$$\mu^T Q \mu - 2\mu^T Q b_M + b_M^T Q b_M - H^2 = l\theta \approx 0, \tag{7}$$

where: $l = \|\mu_1^2 \ \mu_2^2 \ \mu_2^2 \ \mu_1\mu_2 \ \mu_1\mu_3 \ \mu_2\mu_3 \ \mu_1 \ \mu_2 \ \mu_3 \ 1\|$ is the row of 1×10 elements composed of components of one vector magnetometer measurement;

$\theta = \|q_{11} \ q_{22} \ q_{33} \ 2q_{12} \ 2q_{13} \ 2q_{23} | (-2Qb)^T | b^T Qb - H^2\|^T$ is the column of 10×1 elements, the components of which need to be defined.

Approximating equation (7) allows a task of estimating components of θ—column using a redundant set of vector measurements. The value of vector θ is an estimate of the desired vector satisfying the equation:

$$\theta^T \theta = \Sigma_{i=1}^{10} \theta_i^2 = 1, \tag{8}$$

at which the functional $$J(\theta) = \theta^T [\Sigma_{k=1}^N (l_k^T l_k)] \theta \tag{9}$$

reaches a minimal value, where N is the number of vector measurements received for processing, $l_k$ is the vector l of equation (7), made of components of the vector measurement with number k=1 . . . N.

Upon completion a number of difficult and cumbersome operations one can present data preparation for optimizing functional (9) above with the restrictive condition (8) above as a recurrent calculation of matrix 603.

Figure 7:
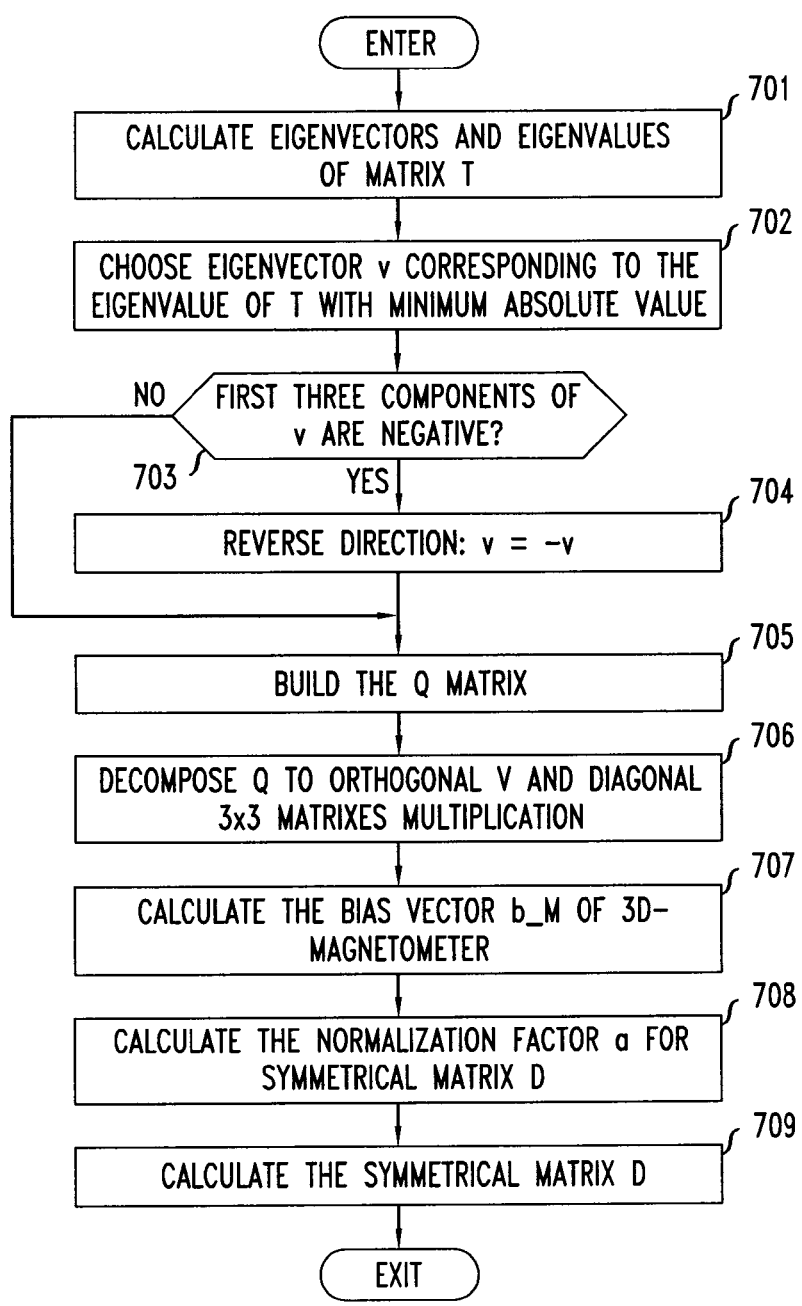
FIG. 7 shows a flowchart of illustrative operations for determining the symmetrical matrix part of a device's magnetic permeability in accordance with an embodiment.

FIG. 7 shows a flowchart of illustrative operations for determining a symmetrical matrix part of a device's magnetic permeability in accordance with an embodiment. In particular, operations for calculating the symmetrical part D of magnetic permeability matrix M are shown in FIG. 7. The operations start with calculating eigenvalues and eigenvectors for matrix T, which recurrently stored in step 701. In step 702, an eigenvector v is selected from these eigenvectors, which corresponds to the minimal value of matrix T:

$$v = \|v_1 v_2 v_3 v_4 v_5 v_6 v_7 v_8 v_9 v_{10}\|^T.$$

If the three first components of the selected vector is smaller than zero, i.e., $v_1 v_2 v_3 < 0$, at step 703, the selected vector changes its direction in step 704: v=−v.

Symmetrical matrix Q is built in 705 from components of the selected vector v:

$$Q = \begin{Vmatrix} v_1 & 0.5v_4 & 0.5v_5 \\ 0.5v_4 & v_2 & 0.5v_6 \\ 0.5v_5 & 0.5v_6 & v_3 \end{Vmatrix}.$$

In 706, matrix Q is expanded (for example, by Jacobi rotation) into a presentation $Q = V^T \operatorname{diag}(\lambda_{q1}, \lambda_{q2}, \lambda_{q3}) V$, where V is the 3×3 orthogonal matrix; $\lambda_{q1}, \lambda_{q2}, \lambda_{q3}$ are the eigenvalues of matrix Q.

Further in 707, components of zero offset vector are calculated:

$$b_M = \begin{Vmatrix} b_{1M} \\ b_{2M} \\ b_{3M} \end{Vmatrix} = -0.5 V \begin{Vmatrix} 1/\lambda_{q1} & 0 & 0 \\ 0 & 1/\lambda_{q2} & 0 \\ 0 & 0 & 1/\lambda_{q3} \end{Vmatrix} V^T \begin{Vmatrix} v_7 \\ v_8 \\ v_9 \end{Vmatrix}.$$

A normalizing factor for the symmetrical part of the magnetic conductivity matrix is calculated in 708:

$$\alpha = -v_{10} + b_{1M}^2 v_1 + b_{2M}^2 v_2 + b_{3M}^2 v_3 + b_{1M} b_{2M} v_4 + b_{1M} b_{3M} v_5 + b_{2M} b_{3M} v_6.$$

The symmetrical part of the magnetic conductivity matrix is calculated in 709:

$$D = \sqrt{\alpha} \, V \begin{Vmatrix} 1/\sqrt{\lambda_{q1}} & 0 & 0 \\ 0 & 1/\sqrt{\lambda_{q2}} & 0 \\ 0 & 0 & 1/\sqrt{\lambda_{q3}} \end{Vmatrix} V^T.$$

A calibration of the orthogonal part U is based on the following property of projections $H_{BF}$ of permanent vector $\vec{H}$ for the Earth's magnetic intensity onto the rotated BF:

$$\dot{H}_{BF} = -\omega \times H_{BF} = -[\omega \times] H_{BF},$$

where: $\omega = \|\omega_1 \; \omega_2 \; \omega_3\|^T$ are the components of BF angular rate being measured by the 3D-gyro.

If m designates such a projection of vector $\vec{H}$ onto the intermediate frame that $H_{BF} = Um$, then a new equation is obtained for vector m:

$$\dot{m} = -U^T[\omega \times] U m = -[(U^T \omega) \times] m = l u, \qquad (10)$$

where: $u = \|u_{11} \; u_{12} \; u_{13} \; u_{21} \; u_{22} \; u_{23} \; u_{31} \; u_{32} \; u_{33}\|^T$ is the vector composed of matrix elements $U = \{u_{ij}\}_{i,j=1 \ldots 3}$, i is the row number, j is the column number:

$$l = \begin{Vmatrix} 0 & -\omega_1 m_3 & \omega_1 m_2 & 0 & -\omega_1 m_3 & \omega_1 m_2 & 0 & -\omega_1 m_3 & \omega_1 m_2 \\ \omega_1 m_3 & 0 & -\omega_1 m_1 & \omega_1 m_3 & 0 & -\omega_1 m_1 & \omega_1 m_3 & 0 & -\omega_1 m_1 \\ -\omega_1 m_2 & \omega_1 m_1 & 0 & -\omega_1 m_2 & \omega_1 m_1 & 0 & -\omega_1 m_2 & \omega_1 m_1 & 0 \end{Vmatrix} = \|\omega_1[m \times] \; \omega_2[m \times] \; \omega_3[m \times]\|$$

In Equation (10) $\dot{m}_k = l_k u$ is valid for each pair of magnetometer measurements $\mu_k$ and gyro measurements $\omega_k$ obtained at the instant k in calibrating rotation of the device, at this, $m_k = D(\mu_k - b_M)$, $l_k$ is the matrix l of (10) composed from components $m_k$ and $\omega_k$. For the whole set $\{\mu_k, \omega_k\}_{k=1}^N$ of N measurement pairs from the 3D-magnetometer and the 3D-gyro during calibrating rotation one can make up a linear system of equations for nine coefficients of matrix U written in the form of vector u:

$$\dot{m}_\Sigma = L u, \; m_\Sigma = \begin{Vmatrix} \dot{m}_1 \\ \vdots \\ \dot{m}_N \end{Vmatrix}, \; L = \begin{Vmatrix} l_1 \\ \vdots \\ l_N \end{Vmatrix}. \qquad (11)$$

The orthogonal matrix can be expanded in a product of three matrices for subsequent reruns about dissimilar axes, for example like this:

$$U = U_1 U_2 U_3 = \begin{Vmatrix} c_2 c_3 & c_2 s_3 & s_2 \\ -c_1 s_3 - c_3 s_1 s_2 & c_1 c_3 - s_1 s_2 s_3 & c_2 s_1 \\ s_1 s_3 - c_1 c_3 s_2 & -c_1 s_2 s_3 - c_3 s_1 & c_1 c_2 \end{Vmatrix} = \begin{Vmatrix} u_{11} & u_{12} & u_{13} \\ u_{21} & u_{22} & u_{23} \\ u_{31} & u_{32} & u_{33} \end{Vmatrix},$$

where: $U_1, \alpha_1$ is the matrix and the angle of rotation about the axis x; $U_2, \alpha_2$ is the matrix and the angle of rotation about the axis y; $U_3, \alpha_3$ is the matrix and the angle of rotation about the axis z; $c_i = \cos \alpha_i$, $s_i = \sin \alpha_i$, i=1, 2, 3.

Therefore, the system of equation (11) is an overdetermined system of non-linear equations for three unknown angles $\alpha_1$, $\alpha_2$, $\alpha_3$. LSM-solution of this system can be obtained by the well-known Newton-Gauss method. After completion of these steps, the data preparation for an iterative solution of this system comes to recurrent storing intermediate matrices 604 $M_1$, 605 $M_2$, 606 $H_1$, 607 $H_2$, 608 W.

Figure 8:
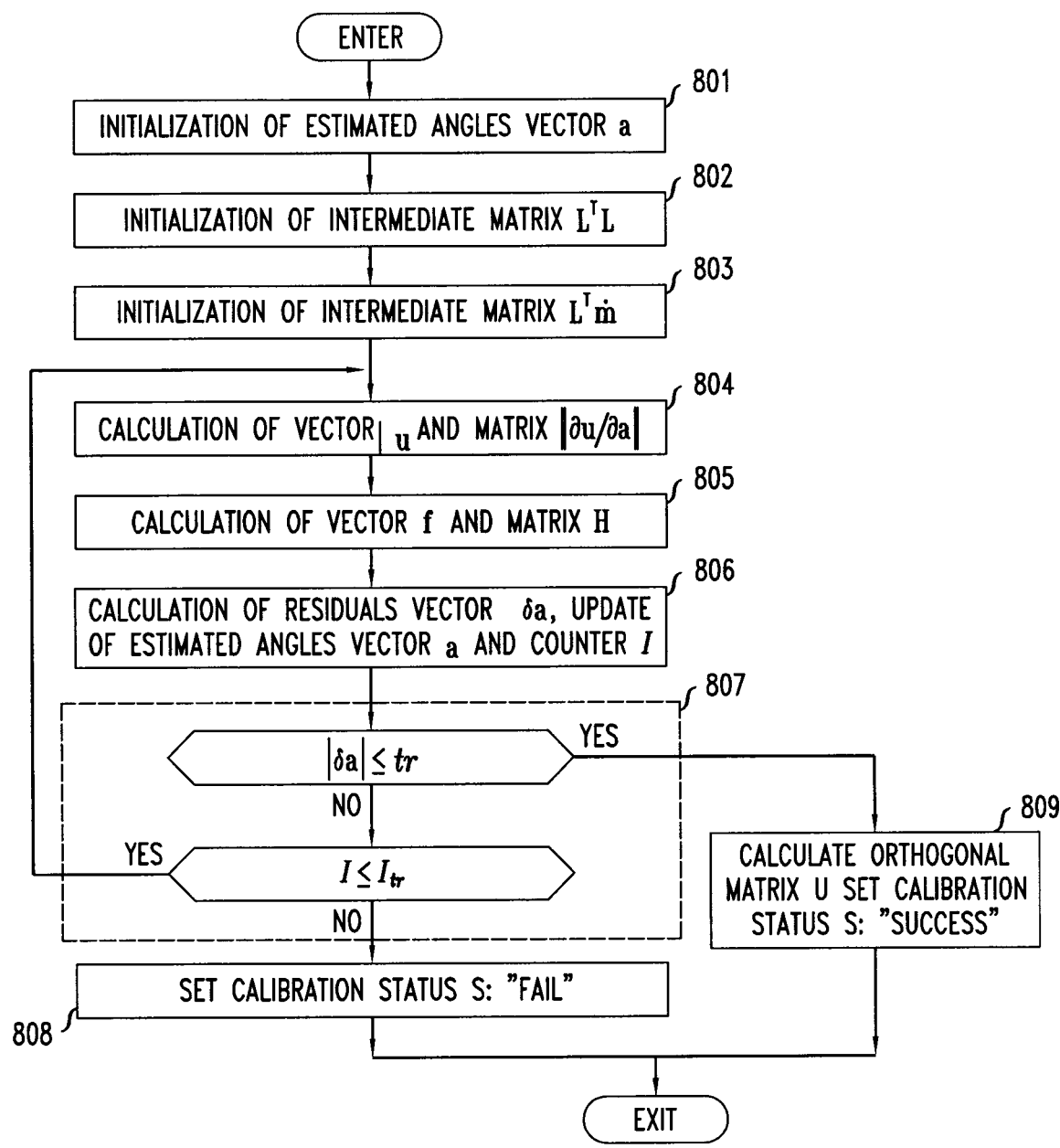
FIG. 8 shows a flowchart of illustrative operations for calculating the orthogonal part of the magnetic permeability matrix in accordance with an embodiment.

FIG. 8 shows a flowchart of illustrative operations for calculating the orthogonal part of the magnetic permeability matrix in accordance with an embodiment. As shown, the initialization of the calculation consists of three steps. At the first step 801, an initial value of the estimated angle vector is set and the iteration counter is reset I=0:

$$\alpha = \|\alpha_1 \alpha_2 \alpha_3\|^T = \|0 \; 0 \; 0\|^T.$$

At the second step 802, intermediate 9×9 matrix $L^T L$ is calculated. The matrix includes coefficients of recurrently-stored matrices 606 $H_1$, 607 $H_2$, 608 W as well as the results of calibration for the symmetrical part $D = \|d_{ij}\|_{i,j=1 \ldots 3}$ and $b_M$:

$$L^T L = \begin{Vmatrix} [L^T L]_{11} & [L^T L]_{12} & [L^T L]_{13} \\ [L^T L]_{12} & [L^T L]_{22} & [L^T L]_{23} \\ [L^T L]_{13} & [L^T L]_{23} & [L^T L]_{33} \end{Vmatrix},$$

$$[L^T L]_{ij} = \sum_{q=1}^{3} \hat{D}_q^T H_{1,ij} \hat{D}_q - \sum_{q=1}^{3} \hat{D}_q^T b_M H_{2,ij}^T \hat{D}_q -$$

$$\sum_{q=1}^{3} \hat{D}_q^T H_{2,ij} b_M^T \hat{D}_q + w_{ij} \sum_{q=1}^{3} \hat{D}_q^T b_M b_M^T \hat{D}_q,$$

$$H_{1,ij} = \begin{Vmatrix} H_1^{ij11} & H_1^{ij12} & H_1^{ij13} \\ H_1^{ij12} & H_1^{ij22} & H_1^{ij23} \\ H_1^{ij13} & H_1^{ij32} & H_1^{ij33} \end{Vmatrix}, H_{2,ij} = \begin{Vmatrix} H_2^{ij1} \\ H_2^{ij2} \\ H_2^{ij3} \end{Vmatrix};$$

$$\hat{D}_1 = \begin{Vmatrix} 0 & -d_{13} & d_{12} \\ 0 & -d_{23} & d_{22} \\ 0 & -d_{33} & d_{23} \end{Vmatrix}, \hat{D}_2 = \begin{Vmatrix} d_{13} & 0 & -d_{11} \\ d_{23} & 0 & -d_{12} \\ d_{33} & 0 & -d_{13} \end{Vmatrix},$$

$$\hat{D}_3 = \begin{Vmatrix} -d_{12} & d_{11} & 0 \\ -d_{22} & d_{12} & 0 \\ -d_{23} & d_{13} & 0 \end{Vmatrix}.$$

At the third initialization step 803, the intermediate 9×9 matrix $L^T \dot{m}$ is calculated. The matrix includes coefficients of recurrently-stored matrices 604 $M_1$, 605 $M_2$ as well as the calibration result of the symmetrical part $D=\|d_{ij}\|_{i,j=1 \ldots 3}$:

$$L^T \dot{m} = \begin{Vmatrix} [L^T \dot{m}]_1 \\ [L^T \dot{m}]_2 \\ [L^T \dot{m}]_3 \end{Vmatrix},$$

$$[L^T \dot{m}]_i = \sum_{q=1}^{3} \hat{D}_q^T M_{1,i} \tilde{D}_q - \sum_{q=1}^{3} \hat{D}_q^T b_M M_{2,i} \tilde{D}_q,$$

$$M_{2,i} = \|M_2^{i1} \quad M_2^{i2} \quad M_2^{i3}\|$$

$$\tilde{D}_1 = \begin{Vmatrix} d_{11} \\ d_{12} \\ d_{13} \end{Vmatrix}, \tilde{D}_2 = \begin{Vmatrix} d_{12} \\ d_{22} \\ d_{23} \end{Vmatrix}, \tilde{D}_3 = \begin{Vmatrix} d_{13} \\ d_{23} \\ d_{33} \end{Vmatrix},$$

$$M_{1,i} = \begin{Vmatrix} M_1^{i11} & M_1^{i12} & M_1^{i13} \\ M_1^{i12} & M_1^{i22} & M_1^{i23} \\ M_1^{i13} & M_1^{i23} & M_1^{i33} \end{Vmatrix}.$$

To do the next iteration, 9×1 vector u and 9×3 matrix $\|\partial u/\partial \alpha\|$ are calculated in step 804 from the current vector of intermediate parameters:

$$u = \begin{Vmatrix} c_2 c_3 \\ c_2 s_3 \\ s_2 \\ -c_1 s_3 - c_3 s_1 s_2 \\ c_1 c_3 - s_1 s_2 s_3 \\ c_2 s_1 \\ s_1 s_3 - c_1 c_3 s_2 \\ -c_1 s_2 s_3 - c_3 s_1 \\ c_1 c_2 \end{Vmatrix},$$

$$\left\| \frac{\partial u}{\partial \alpha} \right\| = \begin{Vmatrix} 0 & -c_3 s_2 & -c_2 s_3 \\ 0 & -s_2 s_3 & c_2 c_3 \\ 0 & c_2 & 0 \\ s_1 s_3 - c_1 c_3 s_2 & -c_2 c_3 s_1 & -c_1 c_3 + s_1 s_2 s_3 \\ c_1 s_2 s_3 - c_3 s_1 & -c_2 s_1 s_3 & -c_3 s_1 s_2 - c_1 s_3 \\ c_1 c_2 & -s_1 s_2 & 0 \\ c_3 s_1 s_2 + c_1 s_2 & -c_1 c_2 c_3 & -c_1 s_2 s_3 + c_3 s_1 \\ -c_1 c_3 + s_1 s_2 s_3 & -c_1 c_2 s_3 & s_1 s_3 - c_1 c_3 s_2 \\ -c_2 s_1 & -c_1 s_2 & 0 \end{Vmatrix},$$

$$c_i = \cos \alpha_i$$
$$s_i = \sin \alpha_i$$
$$i = 1, 2, 3.$$

3×1 vector f and 3×3 matrix H are calculated, in step 805, with the assistance of previously calculated, at steps 802 and 803, permanent matrices $L^T L$ and $L^T \dot{m}$:

$$f = \left\| \frac{\partial u}{\partial \alpha} \right\|^T (L^T \dot{m} - L^T L \hat{u}), H = \left\| \frac{\partial u}{\partial \alpha} \right\|^T L^T L \left\| \frac{\partial u}{\partial \alpha} \right\|.$$

In step 806, a residuals vector and its modulo are calculated: $\delta \alpha = H^{-1} f$, then the vector of intermediate parameters is updated $\alpha = \alpha + \delta \alpha$, the iteration counter is also updated I=I+1.

After the vector is updated, criteria of exit from the iteration(s) are checked in step 807. In particular, this operation is a comparison of the current number of the iteration counter I with a pre-set maximal value of the iteration number $I_{tr}$, and the modulo of the residuals vector $|\delta \alpha|$ with a minimal permissible magnitude of the residual tr.

If $|\delta \alpha| > tr$, $I > I_{tr}$, then the calibration of the orthogonal part is impossible, and the operations terminate with status "Fail" in step 808. A successful completion of the iterative procedure is such that conditions $|\delta \alpha| \le tr$, $I \le I_{tr}$ are simultaneously met. In this case, the orthogonal part U of matrix M is calculated from the current value of the estimated angle vector α and status "Success" is set at step 809:

$$U = \begin{Vmatrix} c_2 c_3 & c_2 s_3 & s_2 \\ -c_1 s_3 - c_3 s_1 s_2 & c_1 c_3 - s_1 s_2 s_3 & c_2 s_1 \\ s_1 s_3 - c_1 c_3 s_2 & -c_1 s_2 s_3 - c_3 s_1 & c_1 c_2 \end{Vmatrix}.$$

A calculation of the orthogonal part of the magnetic conductivity matrix U is carried out by co-processing measurements of the 3D-magnetometer and 3D-gyro. Scaling factors of a gyro's axial sensors are different from nominal ones, and directional vectors of a gyro's sensitivity axes are skewed relative to the similar magnetometer vectors. As a result, components of the orthogonal matrix are erroneously calculated, the errors being a small turn about an unknown rotation axis.

Figure 9:
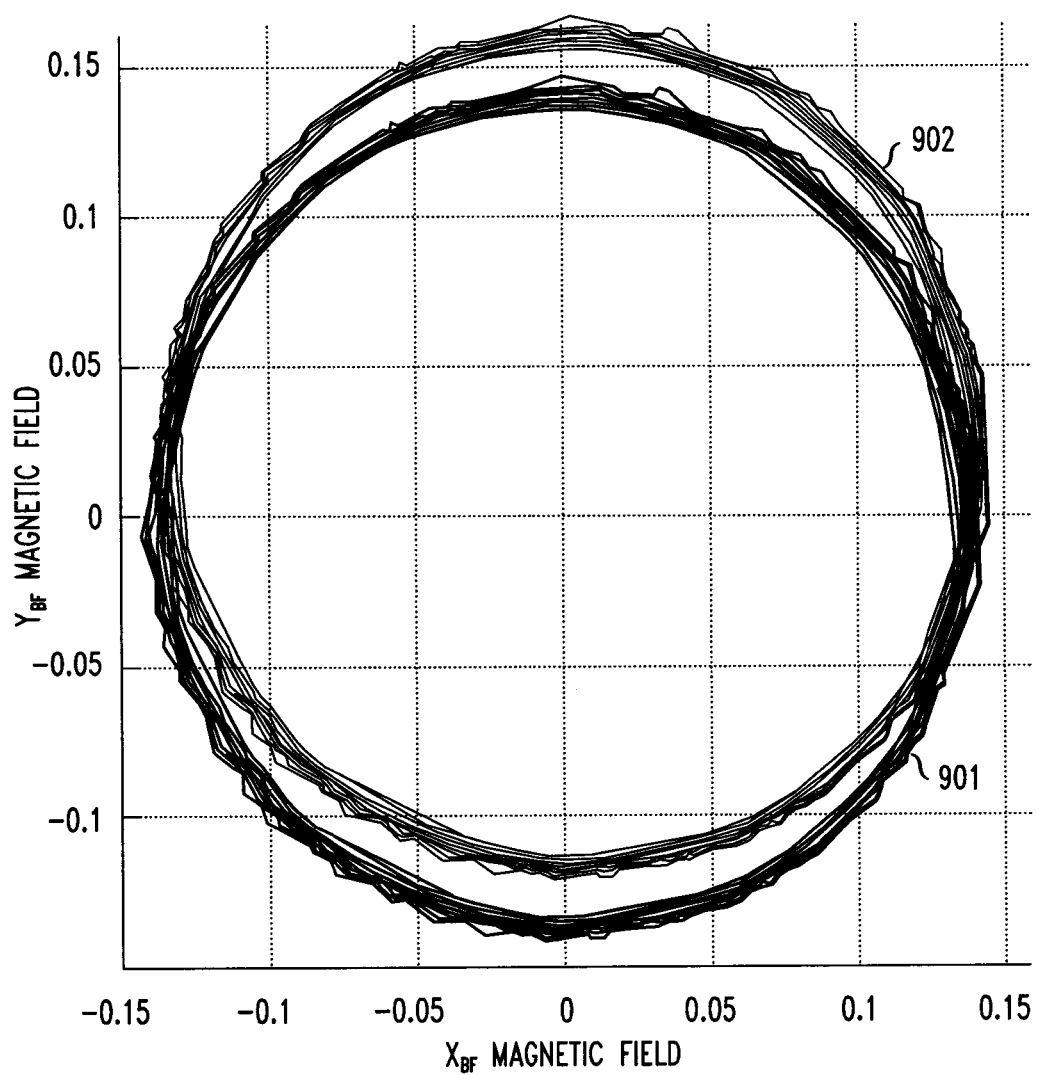
FIG. 9 shows an illustrative diagram of the geometric locus of measurements obtained from magnetometer horizontal sensors in calibration rotation for the third calibration stage for a 3D-magnetometer in accordance with embodiment.

FIG. 9 shows an illustrative diagram of the geometric locus of measurements obtained from magnetometer horizontal sensors in calibration rotation for the third calibration stage 303 for a 3D-magnetometer in accordance with embodiment. In particular, when an electronic device in the uniform magnetic field is rotated about vertical axis $z_{BF}$, the geometric locus of magnetometer measurements read from sensors with axes $x_{BF}$, $y_{BF}$ of the ideal magnetometer is a centered circle 901, as shown in FIG. 9. But due to calibration errors of the matrix orthogonal part this locus is a slightly compressed ellipse 902 with a shifted center. To eliminate these errors, the third calibration stage can be used.

The approximation methods of two-dimensional ellipses are described, for example, in W. Gander, G. H. Golub, R. Strebel Least-Squares Fitting of Circles and Ellipses (hereinafter "Gander"), and are similar to those of three-dimensional ellipsoids as described in Shuster and Markovsky, for example, and are useful in furthering an understanding of the third calibration state 303.

To perform the third calibration stage 303, in accordance with an embodiment, the device is mounted on a fixed tripod such that axis $z_{BF}$ would be up (the same as for the first calibration stage, as detailed above). The fixture needs to allow free rotation about the vertical axis in both directions (clockwise and counterclockwise). The third calibration stage 303 includes a recurrent accumulation of intermediate matrices during calibrating rotation of the fixed device about axis $z_{BF}$ in any direction and further calculation of corrections to the results of the second calibration stage, as detailed above.

Figure 10:
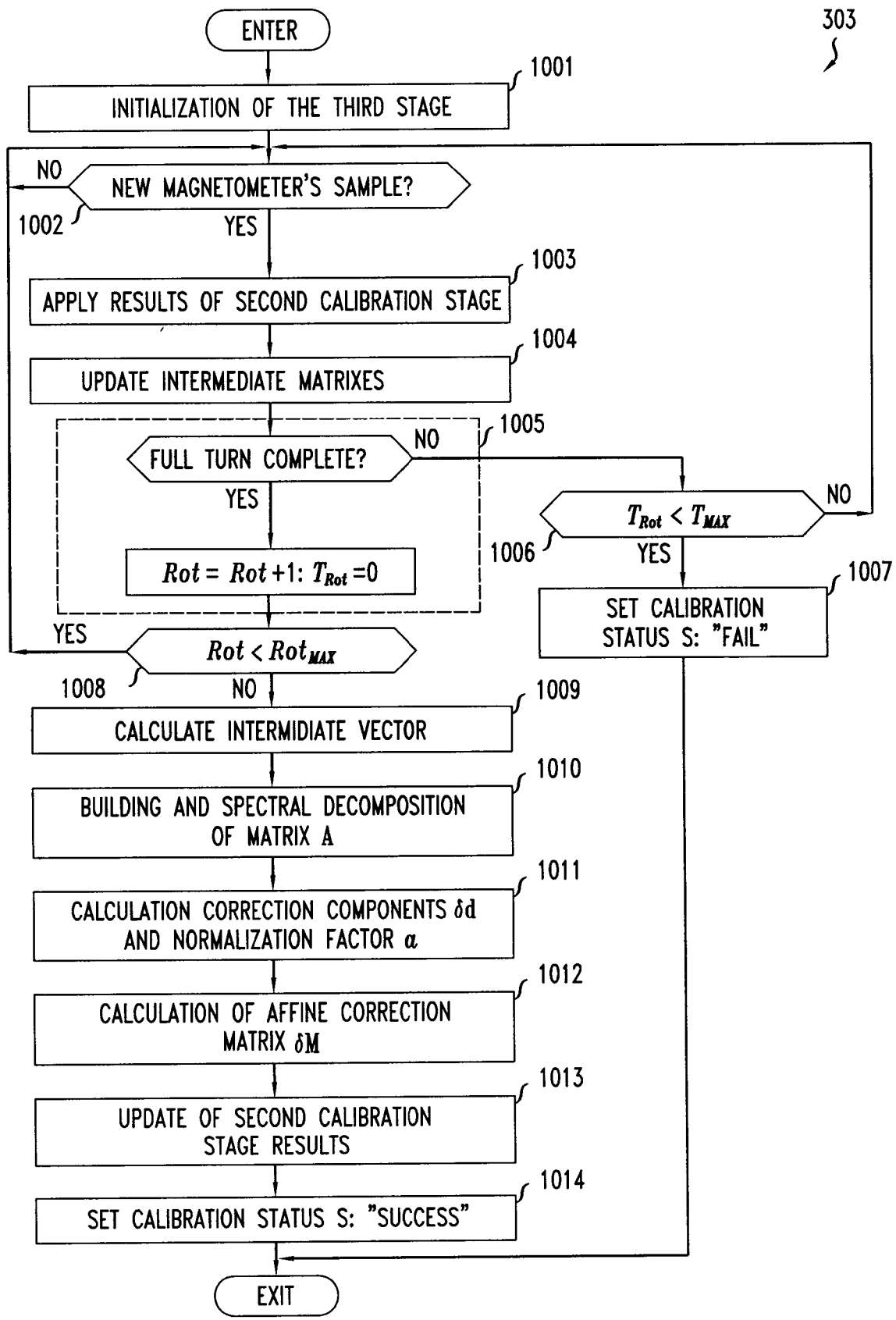
FIG. 10 shows a flowchart of illustrative operations for the third calibration stage of FIG. 3 in accordance with an embodiment.

FIG. 10 shows a flowchart of illustrative operations for the third calibration stage (i.e., third stage 303 shown in FIG. 3) in accordance with an embodiment. At step 1001, an initialization is performed by filling in zeros in intermediate matrices $M_3$ with a dimension of 5×5 and $W_2$ with a dimension of 5×1, the counter of full rotations is reset Rot=0, the timer of waiting for a full rotation is also reset $T_{Rot}=0$.

Upon completion of the initialization of intermediated matrices, the third calibration stage is ready for processing magnetometer measurements (assuming that they have been obtained in calibrating rotation). When waiting, step 1002, for a new magnetometer sample (i.e., measurement) is completed, the results of the second calibration stage are applied, at step 1003, to measurement $\mu_{BF}$ from the magnetometer as:

$$\|H_1 H_2 H_3\|^T = M(\mu_{BF} - b_M).$$

Components $H_1$, $H_2$ of the obtained vector corresponding to axes $x_{BF}$ and $y_{BF}$ are used for recurrent update, at step 1004, of intermediate matrices as follows:

$$h = \|H_2^2 - H_1^2 2H_1 H_2 H_1 H_2 1\|$$

$$M_3 = M_3 + h^T h; W_2 = W_2 - H_1^2 h^T.$$

At step 1005, the number of full rotations Rot is calculated during calibrating rotation, as well as, the time $T_{Rot}$ elapsed from the instant of the last full rotation is controlled, at step 1006. Each full rotation resets the counter of waiting time to zero. If the wait time exceeds a pre-set value $T_{MAX}$, the third calibration stage stops with setting the status in "Fail" position at step 1007.

After the assigned number of full rotations $R_{MAX}$ is reached at step 1008, corrections to the second stage results are calculated. At step 1009, a vector of estimated intermediate parameters is calculated from accumulated intermediate matrices as:

$$u = \|u_1 u_2 u_3 u_4 u_5\|^T = M_3^{-1} W_2.$$

At step 1010, intermediate matrix A is built from components of vector u and spectrally decomposed:

$$A = \left\| \begin{matrix} 1-u_1 & u_2 \\ u_2 & u_1 \end{matrix} \right\| = V^T \mathrm{diag}(\lambda_{A1}, \lambda_{A2}) V,$$

where V is the 2×2 orthogonal matrix, $\lambda_{A1}, \lambda_{A2}$ is the eigenvalues of matrix A.

At step 1011, components of vector $\delta d$ of zero offset corrections for horizontal components of the magnetometer and normalizing multiplier $\alpha$ for the affine correction matrix $\delta M$ are calculated:

$$\delta d = \left\| \begin{matrix} \delta d_1 \\ \delta d_2 \end{matrix} \right\| = -\frac{1}{2} V \mathrm{diag}\left(\frac{1}{\lambda_{A1}}, \frac{1}{\lambda_{A2}}\right) V^T, \alpha = \frac{C^2}{\delta d^T A \delta d - u_5},$$

where: C is the desired circle radius 901.

The affine correction matrix $\delta M$ whose values are normalized by $\sqrt{\alpha}$ is calculated, at step 1012, from the spectral decomposition of matrix A:

$$\delta M = \sqrt{\alpha} V^T \mathrm{diag}(\sqrt{\lambda_{A1}}, \sqrt{\lambda_{A2}}) V.$$

Upon completion of calculating the correcting vector $\delta d$ and matrix $\delta M$ the results of the second calibration stage are updated at step 1013:

$$b_M = b_M + M^{-1} \left\| \begin{matrix} \delta d_1 \\ \delta d_1 \\ 0 \end{matrix} \right\|, \quad M = \left\| \begin{matrix} \delta M & 0 \\ & 0 \\ \hline 0 \ 0 & 1 \end{matrix} \right\| M.$$

After updating the status of the operations, the calibration status S is set in position <<Success>>, at step 1014, and the third calibration stage 303 is completed.

The main result of the third calibration stage is the corrected magnetic conductivity matrix M and zero offset vector $b_M$. These values are accumulated and saved (see, step 306 in FIG. 3) to correct errors in the raw magnetometer measurements before they are used in determining the orientation and magnetic heading.

Figure 11:
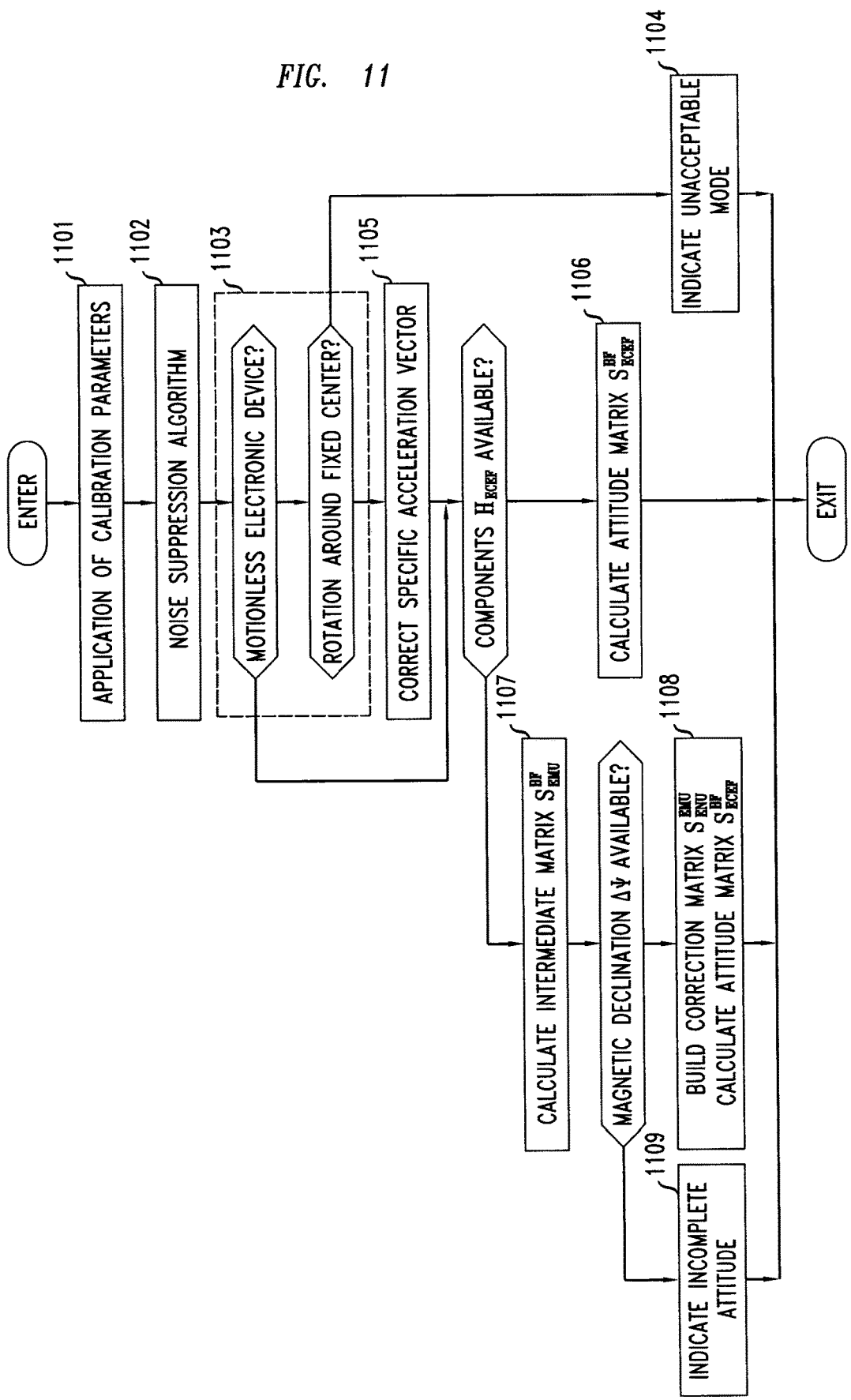
FIG. 11 shows a flowchart of illustrative operations for determining a device's attitude with a 3D-magnetometer and inertial sensors in accordance with an embodiment.

FIG. 11 shows a flowchart of illustrative operations for determining a device's attitude with a 3D-magnetometer and inertial sensors in accordance with an embodiment. In particular, a set of synchronous vector measurements having passed a preliminary verification and transformed to a BF (the lower subscript BF is not shown for the sake of brevity) is used as input as follows: $\hat{n}$ from 3D-accelerometer, $\hat{\omega}$ from 3D-gyro and $\hat{\mu}$ from 3D-magnetometer. As step 1101, the stored calibration results are applied to these measurements:

$$\hat{\omega} = \hat{\omega} - b_G, \hat{n} = \hat{n} - b_A, \hat{H} = M(\hat{\mu} - b_M).$$

At step 1102, these corrected measurements pass through well-known smoothing operations designed for noise suppression to diminish additive components of random noise present in the sensor measurements, and the output measurements are designated $\omega$, n, H.

The attitude of the electronic device is determined for two possible motion modes—stationary and rotating about a fixed center with constant coordinates in BF. A verification of permissible motion modes is executed at step 1103. If the movement of the device does not match the permissible modes, a message about impermissible motion is generated at step 1104 and the operations terminate without calculating attitude parameters.

If the device rotates about a fixed center with constant BF coordinates, then centripetal acceleration in the 3D-accelerometer measurements is corrected in step 1105:

$$n = n + \omega \times [\omega \times l_{BF}],$$

where: $l_{BF} = \|l_{1BF}\ l_{2BF}\ l_{3BF}\|^T$ are the known constant coordinates of the rotation center relative to the measuring center of SA sensor 101 transformed to BF.

If the device is non-movable, there are no additional corrections of 3D-accelerometer measurements.

If the applied model of the Earth's magnetic field allows calculation of projection $H_{ECEF}$ at the location of the electronic device, a direct calculation of matrix $S_{ECEF}^{BF}$ of BF orientation relative to ECEF is produced. In this case, components of two non-collinear vectors $\vec{H}$ and $-\vec{g}$ known in two coordinate systems: $H_{ECEF}$, $-g_{ECEF}$ are calculated from standard models in ECEF, relative to which the orientation should be determined. $H \approx H_{BF}$, $n \approx -g_{BF}$—are determined in BF, whose orientation in ECEF has to be defined. A problem of orienting one Cartesian rectangular coordinate system relative to the other using the components of two non-collinear vectors given in these two coordinate systems is well-known in the navigation field, and there exist a number of techniques for solving such a problem. For example, a classical approach is using a finite number of steps without iterative procedures such as in the well-known algorithms TRIAD and QUEST, as described in M. D. Shuster "Deterministic Three-Axis Attitude Determination", *The Journal of the Astronautical Sciences*, Vol. 52, No. 3, July-September 2004, pp. 405-419. Also, there are well-known recurrent algorithms of orienting one frame relative to another using vector measurements, for example, as described in I. Y. Bar-Itzhack. "REQUEST—A recursive QUEST algorithm for sequential attitude determination", *Journal of Guidance, Control, and Dynamics*, Vol. 19, No. 5 (1996), pp. 1034-1038.

At step 1106, a calculation of orientation parameters for the electronic device according to one of the above well-known algorithms is executed. The result of such a calculation is matrix $S_{ECEF}^{BF}$.

In accordance with an embodiment, it is taken that the Earth's magnetic field model does not provide certain information about vector components $H_{ECEF}$. Instead, magnetic declination $\Delta \psi$ depending on the coordinates of the electronic device is calculated. In this case, at step 1107, an intermediate orthogonal matrix $S_{EMU}^{BF}$ is calculated from corrected measurements H, n:

$$S^{EMU}{}_{BF} = \left\| \frac{H \times n}{|H \times n|} \;\vdots\; \frac{n \times [H \times n]}{|n \times [H \times n]|} \;\vdots\; \frac{n}{|n|} \right\|, \quad S^{BF}{}_{EMU} = (S^{EMU}{}_{BF})^T.$$

A correcting matrix $S_{ENU}^{EMU}$ is composed, at step 1108, from available values of magnetic declination $\Delta \psi$ and matrix $S_{ECEF}^{BF}$ is calculated:

$$S^{EMU}_{ENU} = \left\| \begin{matrix} \cos \Delta \Psi & \sin \Delta \Psi & 0 \\ -\sin \Delta \Psi & \cos \Delta \Psi & 0 \\ 0 & 0 & 1 \end{matrix} \right\|, \quad S^{BF}_{ECEF} = S^{ENU}_{ECEF} S^{EMU}_{SNU} S^{BF}_{EMU}.$$

Matrix $S_{ECEF}^{ENU}$ is calculated from known coordinates of the electronic device B, L, H according to the technique described in Gander.

If the information of Earth's magnetic intensity is unavailable for any of the considered cases (there is no both $H_{ECEF}$ and $\Delta\psi$), then the operations output matrix $S_{EMU}^{BF}$ (in an embodiment) or its equivalent $S_{BF}^{EMU} = (S_{EMU}^{BF})^T$ (in a further embodiment) and sets a flag, at step, 1109 about incomplete orientation of the device.

Matrix $S_{ECEF}^{BF}$ obtained at the output of step 1106 or 1108 can be used to calculate orientation angles $\psi$, $\theta$, $\gamma$ relative to ENU. If there is output data produced via step 1109, then angles $\omega_M$, $\theta_M$, $\gamma_M$, lacking corrections to magnetic declination, can be calculated from matrix coefficients $S_{BF}^{EMU}$. The operations of calculating orientation angles is shown in FIG. 12.

Figure 12:
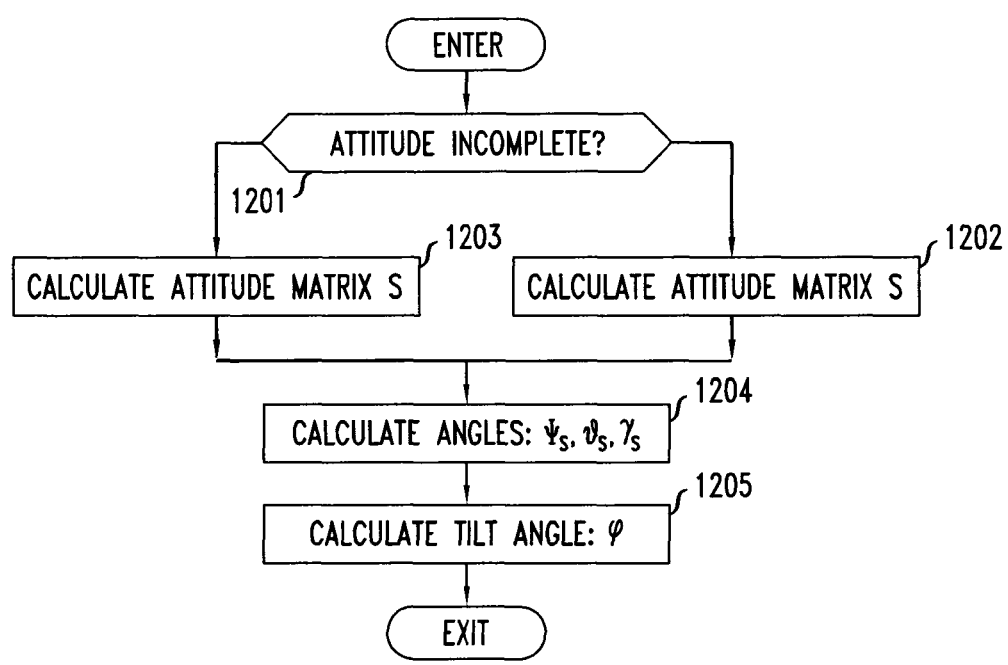
FIG. 12 shows a flowchart of illustrative operations for calculating attitude angles relative to the local coordinate system ENU in accordance with an embodiment.

FIG. 12 shows a flowchart of illustrative operations for calculating attitude angles relative to the local coordinate system ENU in accordance with an embodiment. In particular, before angle calculation starts, a flag of incomplete orientation set in step 1109 (see, FIG. 11) is verified in step 1201. If the orientation is complete, i.e., matrix $S_{ECEF}^{BF}$ is available, then orthogonal matrix S is calculated in step 1202:

$$S = (S_{ECEF}^{BF})^T S_{ECEF}^{ENU},$$

where: matrix $S_{ECEF}^{ENU}$ is calculated from known device coordinates B, L, H in accordance with Gander.

If the orientation is incomplete, matrix $S_{BF}^{EMU}$ is assigned as matrix S in step 1203: $S = S_{BF}^{EMU}$. Heading, roll and pitch angles for the electronic device are calculated from matrix components S in step 1204:

$$\Psi_s = \begin{cases} \arccos \dfrac{a_{22}}{\sqrt{a_{21}^2 + a_{22}^2}}, & a_{21} \leq 0 \\ -\arccos \dfrac{a_{22}}{\sqrt{a_{21}^2 + a_{22}^2}}, & a_{21} > 0 \end{cases};$$

$$\gamma_s = \begin{cases} \arccos \dfrac{a_{33}}{\sqrt{a_{33}^2 + a_{13}^2}}, & a_{13} \leq 0 \\ -\arccos \dfrac{a_{33}}{\sqrt{a_{33}^2 + a_{13}^2}}, & a_{13} > 0 \end{cases},$$

$$\vartheta_s = \arcsin(a_{23})$$

$$S = \left\| \begin{matrix} a_{11} & a_{12} & a_{13} \\ a_{21} & a_{22} & a_{23} \\ a_{31} & a_{32} & a_{33} \end{matrix} \right\|.$$

If the flag from step 1109 (see, FIG. 11) is set, these angles are as follows $\psi_M = \psi_S$, $\theta_M = \theta_S$, $\gamma_M = \gamma_S$. Otherwise, these angles are regarded as orientation angles for the electronic device $\psi = \psi_S$, $\theta = \theta_S$, $\gamma = \gamma_S$ relative to ENU.

Tilt angle $\varphi$ to the vertical is calculated from angles $\theta_M$, $\gamma_M$ or $\theta$, $\gamma$ in 1205, the value of this angle being the same for both combinations of the input angles:

$$\varphi = \arccos(\cos \theta_S \cos \gamma_S) = \arccos(\cos \theta_M \cos \gamma_M) = \arccos(\cos \theta \cos \gamma).$$

In the calculating of angle $\varphi$, at $\varphi = 0$ axis $z_{BF}$ is co-directional to $z_{ENU}$, at $\varphi = \pi/2$ axis $z_{BF}$ is in the plane of the local horizon 212 (see, FIG. 2), at $\varphi = -\pi$ axis $z_{BF}$ is parallel to axis $z_{ENU}$ but directed to the opposite side.

Figure 13:
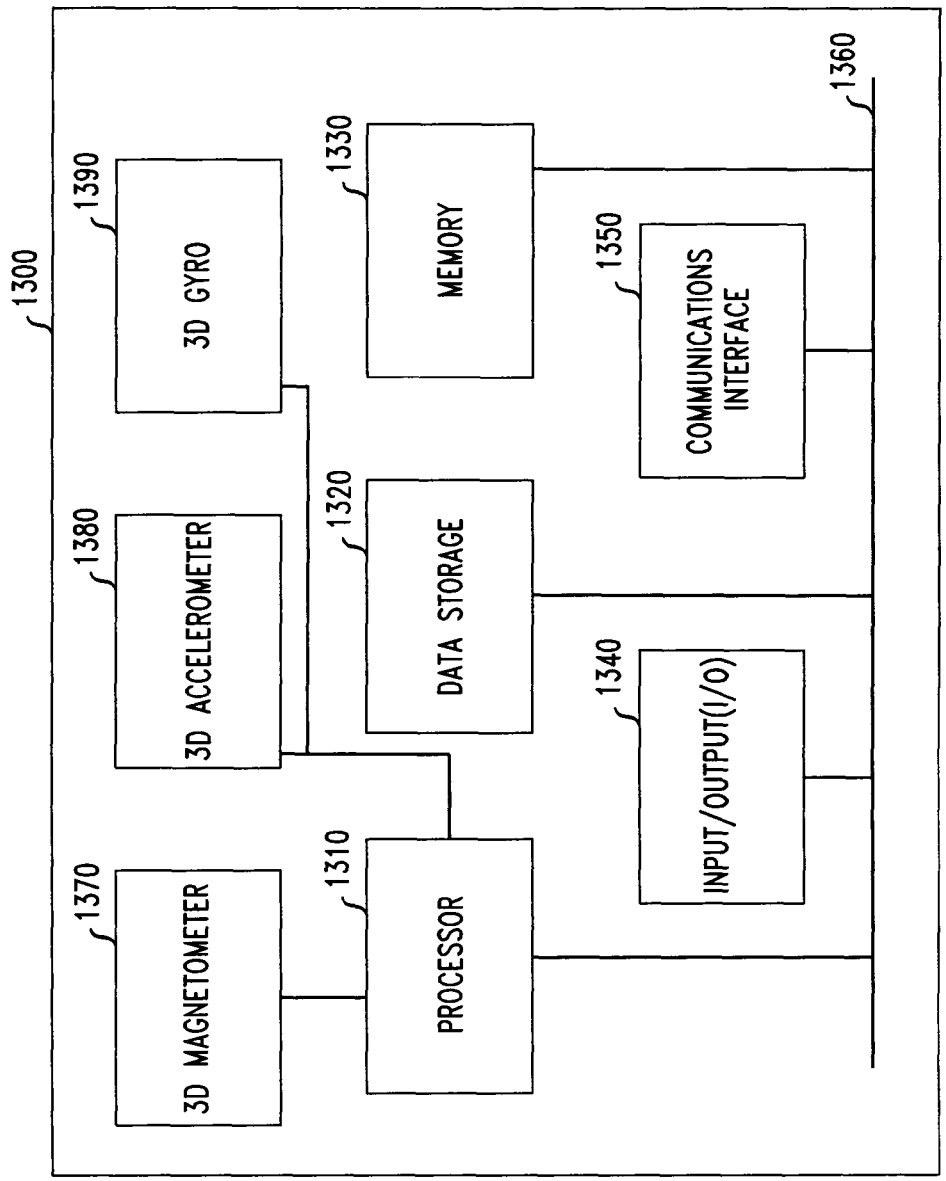
FIG. 13 is a high-level block diagram of an exemplary electronic device in accordance with an embodiment.

The various embodiments herein can be embodied in the form of methods and apparatuses for practicing those methods. The disclosed methods may be performed by a combination of hardware, software, firmware, middleware, and/or non-transitory computer-readable medium installed in and/or communicatively connected to a processor or the like. FIG. 13 is a high-level block diagram of electronic device 1300 which is an exemplary device that may be used in accordance with the various embodiments herein.

Electronic device 1300 comprises a processor 1310 operatively coupled to a data storage device 1320 and a memory 1330. Electronic device 1300 may be any type of device for which calibration of a three axis magnetometer is desirable including, but not limited to, mobile electronic devices such as SNSS receivers, smartphones, tablets, and notebook computers, to name just a few. Processor 1310 controls the overall operation of electronic device 1300 by executing computer program instructions that define such operations. Communications bus 1360 facilitates the coupling and communication between the various components of electronic device 1300. The computer program instructions may be stored in data storage device 1320, or a non-transitory computer readable medium, and loaded into memory 1330 when execution of the computer program instructions is desired.

Thus, certain of the steps of the disclosed method and the associated discussion herein above can be defined by the computer program instructions stored in memory 1330 and/or data storage device 1320 and controlled by processor 1310 executing the computer program instructions. For example, the computer program instructions can be implemented as computer executable code programmed by one skilled in the art to perform the illustrative operations defined by the disclosed embodiments and utilizing 3D-magnetometer 1370, 3D-accelerometer 1380, and 3D-gyro 1390. As will be appreciated, any number of configurations of 3D-magnetometer 1370, 3D-accelerometer 1380, and 3D-gyro 1390 are possible in accordance with the disclosed embodiments. For example, 3D-accelerometer 1380, and 3D-gyro 1390 may be integrated within an inertial measurement unit (IMU) in a well-known manner to name one such possible configuration.

Accordingly, by executing the computer program instructions, processor 1310 executes an algorithm defined by the disclosed method. Electronic device 1300 also includes one or more communications interface 1350 for communicating with other devices via a network (e.g., a wireless communications network) or communications protocol (e.g., Bluetooth®). For example, such communication interfaces may be a receiver, transceiver or modem for exchanging wired or wireless communications in any number of well-known fashions. Electronic device 1300 also includes one or more input/output devices 1340 that enable user interaction with electronic device 1300 (e.g., camera, display, keyboard, mouse, speakers, microphone, buttons, etc.).

Processor 1310 may include both general and special purpose microprocessors, and may be the sole processor or one of multiple processors of electronic device 1300. Processor 1310 may comprise one or more central processing units (CPUs), for example. Processor 1310, data storage device 1320, and/or memory 1330 may include, be supplemented by, or incorporated in, one or more application-specific integrated circuits (ASICs) and/or one or more field programmable gate arrays (FPGAs).

Data storage device 1320 and memory 1330 may each comprise a tangible non-transitory computer readable storage medium. Data storage device 1320, and memory 1330, may each include high-speed random access memory, such as dynamic random access memory (DRAM), static random access memory (SRAM), double data rate synchronous dynamic random access memory (DDR RAM), or other random access solid state memory devices, and may include non-volatile memory, such as one or more magnetic disk storage devices such as internal hard disks and removable disks, magneto-optical disk storage devices, optical disk storage devices, flash memory devices, semiconductor memory devices, such as erasable programmable read-only memory (EPROM), electrically erasable programmable read-only memory (EEPROM), compact disc read-only memory (CD-ROM), digital versatile disc read-only memory (DVD-ROM) disks, or other non-volatile solid state storage devices.

Input/output devices 1340 may include peripherals, such as a camera, printer, scanner, display screen, etc. For example, input/output devices 1340 may include a display device such as a cathode ray tube (CRT), plasma or liquid crystal display (LCD) monitor for displaying information to the user, a keyboard, and a pointing device such as a mouse or a trackball by which the user can provide input to electronic device 1300.

It should be noted that for clarity of explanation, the illustrative embodiments described herein may be presented as comprising individual functional blocks or combinations of functional blocks. The functions these blocks represent may be provided through the use of either dedicated or shared hardware, including, but not limited to, hardware capable of executing software. Illustrative embodiments may comprise digital signal processor ("DSP") hardware and/or software performing the operation described herein. Thus, for example, it will be appreciated by those skilled in the art that the block diagrams herein represent conceptual views of illustrative functions, operations and/or circuitry of the principles described in the various embodiments herein. Similarly, it will be appreciated that any flowcharts, flow diagrams, state transition diagrams, pseudo code, program code and the like represent various processes which may be substantially represented in computer readable medium and so executed by a computer, machine or processor, whether or not such computer, machine or processor is explicitly shown. One skilled in the art will recognize that an implementation of an actual computer or computer system may have other structures and may contain other components as well, and that a high level representation of some of the components of such a computer is for illustrative purposes.

The foregoing Detailed Description is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that various modifications may be implemented by those skilled in the art without departing from the scope and spirit of the invention. Those skilled in the art could implement various other feature combinations without departing from the scope and spirit of the invention.

The invention claimed is:

1. A method comprising:
  receiving, from a 3-axis accelerometer associated with a device, acceleration measurements represented as three orthogonal axis projections of a specific acceleration vector associated with the device;
  receiving, from a 3-axis gyro associated with the device, angular velocity measurements represented as three orthogonal axis projections of an angular rate vector associated with the device;
  receiving, from a 3-axis magnetometer associated with the device, magnetic field measurements represented as three orthogonal axis projections of a magnetic field vector associated with the device;

calibrating the 3-axis magnetometer as a function of a field calibration having one or more calibration stages selected from a first calibration stage for determining zero offsets for the 3-axis accelerometer and the 3-axis gyro, a second calibration stage for determining numerical parameters for a 3-axis magnetometer errors model, and a third calibration stage for performing a correction of the numerical parameters for the 3-axis magnetometer errors model;

establishing an orientation of sensitivity axes for each of the accelerometer, the gyro, and the magnetometer relative to a coordinate system associated with the device; and receiving, during the field calibration, a plurality of numerical parameters of an errors model for each of the 3-axis accelerometer, the 3-axis gyro, and the 3-axis magnetometer, wherein the determining zero offsets for the 3-axis accelerometer and the 3-axis gyro of the first calibration stage comprises:
  aligning a third orthogonal base frame axis of the device along a local vertical line, the device being associated with a fixed base;
  averaging a first plurality of vector measurements from the gyro for a first time period;
  averaging a second plurality of vector measurements from the accelerometer for the first time period;
  determining a first zero offset vector for the gyro using the averaged first plurality of vector measurements;
  calculating an absolute value of a local free fall acceleration using at least an Earth's gravitational model and specified geographic coordinates;
  correcting, using the absolute value of the local free fall acceleration, particular ones of the averaged values from the second plurality of vector measurements from the accelerometer associated with the third orthogonal accelerometer axis of the 3-axis accelerometer; and
  determining a second zero offset vector for the accelerometer using particular ones of the averaged values from the first and the second orthogonal axes of the 3-axis accelerometer, and the corrected particular ones of the averaged values from the second plurality of vector measurements associated with the third orthogonal accelerometer axis.

2. The method of claim 1, wherein the determining parameters for the 3-axis magnetometer errors model of the second calibration stage further comprises:
  selecting a calibration location distant from at least one of an artificial magnetic field source and one or more objects having measureable magnetic properties originating external to the device;
  defining a first plurality of intermediate matrices, the first plurality of intermediate matrices including at least the following intermediate matrices: intermediate matrix T, intermediate matrix $M_1$, intermediate matrix $M_2$, intermediate matrix $H_1$, intermediate matrix $H_2$, and intermediate matrix W;
  rotating the device about different base frame axes for a second time period;
  updating, during the second time period, the first plurality of intermediate matrices using the magnetic field vector measurements and the angular rate vector measurements;
  calculating a symmetric part D of a magnetic permeability matrix M and a zero offset vector $b_M$ for the magnetometer using the intermediate matrix obtained from the magnetic field vector measurements;
  calculating an orthogonal part U of the magnetic permeability matrix M; and
  calculating the magnetic permeability matrix M using the calculated symmetric part D and the orthogonal part U.

3. The method of claim 2, wherein the magnetic permeability matrix M is calculated by multiplying the calculated symmetric part D with the orthogonal part U.

4. The method of claim 2, wherein the performing the correction of the parameters for the 3-axis magnetometer errors model of the third calibration stage further comprises:
  aligning a rotation axis of the fixed base associated the device with the local vertical line;
  aligning the third orthogonal base frame axis of the device with the rotation axis;
  defining a second plurality of intermediate matrices, the second plurality of intermediate matrices including at least the following intermediate matrices: intermediate matrix $M_3$ and intermediate matrix $W_2$;
  rotating the device about the rotation axis for a set of rotations;
  updating, during the set of rotations, the second plurality of intermediate matrices using magnetic field vector measurements;
  calculating a plurality of correction components $\delta d$ and a normalization factor $\alpha$ using the intermediate matrix $M_3$ and intermediate matrix $W_2$;
  calculating an affine correction matrix $\delta M$ for the magnetic permeability matrix M using the intermediate matrix $M_3$ and intermediate matrix $W_2$;
  updating the zero offset vector $b_M$ for the magnetometer using the intermediate matrix $M_3$ and intermediate matrix $W_2$; and
  updating the magnetic permeability matrix M using the zero offset vector $b_M$ for the magnetometer and the affine correction matrix.

5. The method of claim 4, further comprising:
  calculating an attitude of the device relative to an intermediate coordinate system using the acceleration vector measurements and the magnetic field vector measurements; and
  calculating, using the attitude, a magnetic heading angle and tilt angle relative to a local vertical.

6. The method of claim 4, wherein the device is rotating in space about a fixed point, the method further comprising:
  calculating an attitude of the device relative to an intermediate coordinate system using the acceleration vector measurements, the angular velocity vector measurements and the magnetic field vector measurements; and
  calculating, using the attitude, a magnetic heading angle and tilt angle relative to a local vertical.

7. The method of claim 4 further comprising:
  calculating an attitude of the device relative to an intermediate coordinate system using the acceleration vector measurements and the magnetic field vector measurements;
  receiving geographic coordinates of the device at an instant of the calculated attitude;
  calculating a plurality of rotation parameters using a magnetic declination angle obtained using a magnetic field model of the Earth and the geographic coordinates;
  correcting a first set of attitude parameters of the device relative to an intermediate coordinate system as a function of a magnetic declination angle rotation and a second set of attitude parameters relative to a local coordinate system ENU;

calculating a third set of attitude parameters of the device relative a global coordinate system ECEF using the geographic coordinates and the second set of attitude parameters relative to the local coordinate system ENU; and calculating, using the first set of attitude parameters, the second set of attitude parameters and the third set of attitude parameters, a set of angles of device attitude relative to the local coordinate system ENU, and a tilt angle relative to a local vertical.

8. The method of claim 4, wherein the device is rotating in space about a fixed point, the method further comprising:

correcting at least one centripetal acceleration component of the acceleration vector measurements using the angular velocity vector measurements;

calculating a set of attitude parameters associated with the device relative to an intermediate coordinate system using the acceleration vector measurements and the magnetic field vector measurements;

receiving geographic coordinates of the device at an instant of the calculated attitude;

calculating a set of rotation parameters associated with the device using a magnetic declination angle obtained from a magnetic field model of the Earth and the geographic coordinates;

correcting the set of rotation parameters associated with device as a function of the magnetic declination angle and the geographic coordinates;

correcting a first set of orientation parameters associated with the device relative to an intermediate coordinate system to obtain orientation parameters relative a local coordinate system ENU;

calculating a second set of orientation parameters of the device relative a global coordinate system ECEF using the geographic coordinates and the first set of orientation parameters relative to the local coordinate system ENU; and calculating, using the set of rotation parameters, the first set of orientation parameters and the second set of orientation parameters, a set of angles of housing attitude relative to the local coordinate system ENU, and a tilt angle relative to a local vertical.

9. The method of claim 1, further comprising:

determining a magnetic heading of the device using the calibrated 3-axis magnetometer.

10. A device comprising:

a 3-axis accelerometer;

a 3-axis gyro;

a 3-axis magnetometer;

a processor; and a memory coupled with the processor, the memory having a program that stores computer program instructions that when executed cause the processor to perform operations for:

receiving, from the 3-axis accelerometer, acceleration measurements represented as three orthogonal axis projections of a specific acceleration vector associated with the device;

receiving, from the 3-axis gyro, angular velocity measurements represented as three orthogonal axis projections of an angular rate vector associated with the device;

receiving, from the 3-axis magnetometer, magnetic field measurements represented as three orthogonal axis projections of a magnetic field vector associated with the device;

calibrating the 3-axis magnetometer as a function of a field calibration having one or more calibration stages selected from a first calibration stage for determining zero offsets for the 3-axis accelerometer and the 3-axis gyro, a second calibration stage for determining numerical parameters for a 3-axis magnetometer errors model, and a third calibration stage for performing a correction of the numerical parameters for the 3-axis magnetometer errors model;

establishing an orientation of sensitivity axes for each of the accelerometer, the gyro, and the magnetometer relative to a coordinate system associated with the device; and receiving, during the field calibration, a plurality of numerical parameters of an errors model for each of the 3-axis accelerometer, the 3-axis gyro, and the 3-axis magnetometer, wherein the determining zero offsets for the 3-axis accelerometer and the 3-axis gyro of the first calibration stage further comprises:

aligning a third orthogonal base frame axis of the device along a local vertical line, the device being associated with a fixed base;

averaging a first plurality of vector measurements from the gyro for a first time period;

averaging a second plurality of vector measurements from the accelerometer for the first time period;

determining a first zero offset vector for the gyro using the averaged first plurality of vector measurements;

calculating an absolute value of a local free fall acceleration using at least an Earth's gravitational model and specified geographic coordinates;

correcting, using the absolute value of the local free fall acceleration, particular ones of the averaged values from the second plurality of vector measurements from the accelerometer associated with the third orthogonal accelerometer axis of the 3-axis accelerometer; and determining a second zero offset vector for the accelerometer using particular ones of the averaged values from the first and the second orthogonal axes of the 3-axis accelerometer, and the corrected particular ones of the averaged values from the second plurality of vector measurements associated with the third orthogonal accelerometer axis.

11. The device of claim 10, wherein the determining parameters for the 3-axis magnetometer errors model of the second calibration stage further comprises:

selecting a calibration location distant from at least one of an artificial magnetic field source and one or more objects having measureable magnetic properties originating external to the device;

defining a first plurality of intermediate matrices, the first plurality of intermediate matrices including at least the following intermediate matrices: intermediate matrix T, intermediate matrix $M_1$, intermediate matrix $M_2$, intermediate matrix $H_1$, intermediate matrix $11_2$, and intermediate matrix W;

rotating the device about different base frame axes for a second time period;

updating, during the second time period, the first plurality of intermediate matrices using the magnetic field vector measurements and the angular rate vector measurements;

calculating a symmetric part D of a magnetic permeability matrix M and a zero offset vector $b_M$ for the magnetometer using the intermediate matrix obtained from the magnetic field vector measurements;

calculating an orthogonal part U of the magnetic permeability matrix M; and calculating the magnetic permeability matrix M using the calculated symmetric part D and the orthogonal part U.

12. The device of claim 11, wherein the performing the correction of the parameters for the 3-axis magnetometer errors model of the third calibration stage further comprises:

aligning a rotation axis of the fixed base associated the device with the local vertical line;

aligning the third orthogonal base frame axis of the device with the rotation axis;

defining a second plurality of intermediate matrices, the second plurality of intermediate matrices including at least the following intermediate matrices: intermediate matrix $M_3$ and intermediate matrix $W_2$;

rotating the device about the rotation axis for a set of rotations;

updating, during the set of rotations, the second plurality of intermediate matrices using magnetic field vector measurements;

calculating a plurality of correction components $\delta d$ and a normalization factor $\alpha$ using the intermediate matrix $M_3$ and intermediate matrix $W_2$;

calculating an affine correction matrix $\delta M$ for the magnetic permeability matrix M using the intermediate matrix $M_3$ and intermediate matrix $W_2$;

updating the zero offset vector $b_M$ for the magnetometer using the intermediate matrix $M_3$ and intermediate matrix $W_2$; and updating the magnetic permeability matrix M using the zero offset vector $b_M$ for the magnetometer and the affine correction matrix.

13. The device of claim 12, wherein the operations further comprise:

calculating an attitude of the device relative to an intermediate coordinate system using the acceleration vector measurements and the magnetic field vector measurements; and calculating, using the attitude, a magnetic heading angle and tilt angle relative to a local vertical.

14. The device of claim 12, wherein the device is rotating in space about a fixed point, and the operations further comprise:

calculating an attitude of the device relative to an intermediate coordinate system using the acceleration vector measurements, the angular velocity vector measurements and the magnetic field vector measurements; and calculating, using the attitude, a magnetic heading angle and tilt angle relative to a local vertical.

15. The device of claim 12, wherein the operations further comprise:

calculating an attitude of the device relative to an intermediate coordinate system using the acceleration vector measurements and the magnetic field vector measurements;

receiving geographic coordinates of the device at an instant of the calculated attitude;

calculating a plurality of rotation parameters using a magnetic declination angle obtained using a magnetic field model of the Earth and the geographic coordinates;

correcting a first set of attitude parameters of the device relative to an intermediate coordinate system as a function of a magnetic declination angle rotation and a second set of attitude parameters relative to a local coordinate system ENU;

calculating a third set of attitude parameters of the device relative a global coordinate system ECEF using the geographic coordinates and the second set of attitude parameters relative to the local coordinate system ENU; and calculating, using the first set of attitude parameters, the second set of attitude parameters and the third set of attitude parameters, a set of angles of device attitude relative to the local coordinate system ENU, and a tilt angle relative to a local vertical.

16. The device of claim 12, wherein the device is rotating in space about a fixed point, and the operations further comprise:

correcting at least one centripetal acceleration component of the acceleration vector measurements using the angular velocity vector measurements;

calculating a set of attitude parameters associated with the device relative to an intermediate coordinate system using the acceleration vector measurements and the magnetic field vector measurements;

receiving geographic coordinates of the device at an instant of the calculated attitude;

calculating a set of rotation parameters associated with the device using a magnetic declination angle obtained from a magnetic field model of the Earth and the geographic coordinates;

correcting the set of rotation parameters associated with device as a function of the magnetic declination angle and the geographic coordinates;

correcting a first set of orientation parameters associated with the device relative to an intermediate coordinate system to obtain orientation parameters relative a local coordinate system ENU;

calculating a second set of orientation parameters of the device relative a global coordinate system ECEF using the geographic coordinates and the first set of orientation parameters relative to the local coordinate system ENU; and calculating, using the set of rotation parameters, the first set of orientation parameters and the second set of orientation parameters, a set of angles of housing attitude relative to the local coordinate system ENU, and a tilt angle relative to a local vertical.

17. The device of claim 10, wherein the operations further comprise:

determining a magnetic heading of the device using the calibrated 3-axis magnetometer.

18. A non-transitory computer-readable medium, storing computer program instructions for calibrating a device, the computer program instructions, when executed on a processor, cause the processor to perform operations comprising:

receiving, from a 3-axis accelerometer associated with the device, acceleration measurements represented as three orthogonal axis projections of a specific acceleration vector associated with the device;

receiving, from a 3-axis gyro associated with the device, angular velocity measurements represented as three orthogonal axis projections of an angular rate vector associated with the device;

receiving, from a 3-axis magnetometer associated with the device, magnetic field measurements represented as three orthogonal axis projections of a magnetic field vector associated with the device;

calibrating the 3-axis magnetometer as a function of a field calibration having one or more calibration stages selected from a first calibration stage for determining zero offsets for the 3-axis accelerometer and the 3-axis gyro, a second calibration stage for determining numerical parameters for a 3-axis magnetometer errors model, and a third calibration stage for performing a correction of the numerical parameters for the 3-axis magnetometer errors model;

establishing an orientation of sensitivity axes for each of the accelerometer, the gyro, and the magnetometer relative to a coordinate system associated with the device; and receiving, during the field calibration, a plurality of numerical parameters of an errors model for each of the 3-axis accelerometer, the 3-axis gyro, and the 3-axis magnetometer, wherein the determining zero offsets for the 3-axis accelerometer and the 3-axis gyro of the first calibration stage further comprises:

aligning a third orthogonal base frame axis of the device along a local vertical line, the device being associated with a fixed base;

averaging a first plurality of vector measurements from the gyro for a first time period;

averaging a second plurality of vector measurements from the accelerometer for the first time period;

determining a first zero offset vector for the gyro using the averaged first plurality of vector measurements;

calculating an absolute value of a local free fall acceleration using at least an Earth's gravitational model and specified geographic coordinates;

correcting, using the absolute value of the local free fall acceleration, particular ones of the averaged values from the second plurality of vector measurements from the accelerometer associated with the third orthogonal accelerometer axis of the 3-axis accelerometer; and determining a second zero offset vector for the accelerometer using particular ones of the averaged values from the first and the second orthogonal axes of the 3-axis accelerometer, and the corrected particular ones of the averaged values from the second plurality of vector measurements associated with the third orthogonal accelerometer axis.

19. The non-transitory computer-readable medium of claim 18, wherein the determining parameters for the 3-axis magnetometer errors model of the second calibration stage further comprises:

selecting a calibration location distant from at least one of an artificial magnetic field source and one or more objects having measureable magnetic properties originating external to the device;

defining a first plurality of intermediate matrices, the first plurality of intermediate matrices including at least the following intermediate matrices: intermediate matrix T, intermediate matrix $M_1$, intermediate matrix $M_2$, intermediate matrix $H_1$, intermediate matrix $H_2$, and intermediate matrix W;

rotating the device about different base frame axes for a second time period;

updating, during the second time period, the first plurality of intermediate matrices using the magnetic field vector measurements and the angular rate vector measurements;

calculating a symmetric part D of a magnetic permeability matrix M and a zero offset vector $b_M$ for the magnetometer using the intermediate matrix obtained from the magnetic field vector measurements;

calculating an orthogonal part U of the magnetic permeability matrix M; and calculating the magnetic permeability matrix M using the calculated symmetric part D and the orthogonal part U.

20. The non-transitory computer-readable medium of claim 19, wherein the magnetic permeability matrix M is calculated by multiplying the calculated symmetric part D with the orthogonal part U.

21. The non-transitory computer-readable medium of claim 19, wherein the performing the correction of the parameters for the 3-axis magnetometer errors model of the third calibration stage further comprises:

aligning a rotation axis of the fixed base associated the device with the local vertical line;

aligning the third orthogonal base frame axis of the device with the rotation axis;

defining a second plurality of intermediate matrices, the second plurality of intermediate matrices including at least the following intermediate matrices: intermediate matrix $M_3$ and intermediate matrix $W_2$;

rotating the device about the rotation axis for a set of rotations;

updating, during the set of rotations, the second plurality of intermediate matrices using magnetic field vector measurements;

calculating a plurality of correction components $\delta d$ and a normalization factor $\alpha$ using the intermediate matrix $M_3$ and intermediate matrix $W_2$;

calculating an affine correction matrix $\delta M$ for the magnetic permeability matrix M using the intermediate matrix $M_3$ and intermediate matrix $W_2$;

updating the zero offset vector $b_M$ for the magnetometer using the intermediate matrix $M_3$ and intermediate matrix $W_2$; and updating the magnetic permeability matrix M using the zero offset vector $b_M$ for the magnetometer and the affine correction matrix.

22. The non-transitory computer-readable medium of claim 21, wherein the operations further comprise:

calculating an attitude of the device relative to an intermediate coordinate system using the acceleration vector measurements and the magnetic field vector measurements; and calculating, using the attitude, a magnetic heading angle and tilt angle relative to a local vertical.

23. The non-transitory computer-readable medium of claim 21, wherein the device is rotating in space about a fixed point, and the operations further comprise:

calculating an attitude of the device relative to an intermediate coordinate system using the acceleration vector measurements, the angular velocity vector measurements and the magnetic field vector measurements; and calculating, using the attitude, a magnetic heading angle and tilt angle relative to a local vertical.

24. The non-transitory computer-readable medium of claim 21, wherein the operations further comprise:

calculating an attitude of the device relative to an intermediate coordinate system using the acceleration vector measurements and the magnetic field vector measurements;

receiving geographic coordinates of the device at an instant of the calculated attitude;

calculating a plurality of rotation parameters using a magnetic declination angle obtained using a magnetic field model of the Earth and the geographic coordinates;

correcting a first set of attitude parameters of the device relative to an intermediate coordinate system as a function of a magnetic declination angle rotation and a second set of attitude parameters relative to a local coordinate system ENU;

calculating a third set of attitude parameters of the device relative a global coordinate system ECEF using the geographic coordinates and the second set of attitude parameters relative to the local coordinate system ENU; and calculating, using the first set of attitude parameters, the second set of attitude parameters and the third set of attitude parameters, a set of angles of device attitude relative to the local coordinate system ENU, and a tilt angle relative to a local vertical.

25. The non-transitory computer-readable medium of claim 21, wherein the device is rotating in space about a fixed point, and the operations further comprise:

correcting at least one centripetal acceleration component of the acceleration vector measurements using the angular velocity vector measurements;

calculating a set of attitude parameters associated with the device relative to an intermediate coordinate system using the acceleration vector measurements and the magnetic field vector measurements;

receiving geographic coordinates of the device at an instant of the calculated attitude;

calculating a set of rotation parameters associated with the device using a magnetic declination angle obtained from a magnetic field model of the Earth and the geographic coordinates;

correcting the set of rotation parameters associated with device as a function of the magnetic declination angle and the geographic coordinates;

correcting a first set of orientation parameters associated with the device relative to an intermediate coordinate system to obtain orientation parameters relative a local coordinate system ENU;

calculating a second set of orientation parameters of the device relative a global coordinate system ECEF using the geographic coordinates and the first set of orientation parameters relative to the local coordinate system ENU; and calculating, using the set of rotation parameters, the first set of orientation parameters and the second set of orientation parameters, a set of angles of housing attitude relative to the local coordinate system ENU, and a tilt angle relative to a local vertical.

26. The non-transitory computer-readable medium of claim 18, wherein the operations further comprise:

determining a magnetic heading of the device using the calibrated 3-axis magnetometer.

* * * * *